(12) United States Patent
Aruga et al.

(10) Patent No.: US 9,373,621 B2
(45) Date of Patent: Jun. 21, 2016

(54) ANALOG CIRCUIT CELL ARRAY HAVING SOME TRANSISTORS THAT INCLUDE TWO CONNECTED GATE ELECTRODES AND TWO CONNECTED SOURCE REGIONS

(71) Applicant: Cypress Semiconductor Corporation, San Jose, CA (US)

(72) Inventors: Kenta Aruga, Yokohama (JP); Suguru Tachibana, Yokohama (JP); Koji Okada, Yokohama (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/746,477

(22) Filed: Jan. 22, 2013

(65) Prior Publication Data

US 2013/0140642 A1    Jun. 6, 2013

Related U.S. Application Data

(63) Continuation of application No. 12/617,608, filed on Nov. 12, 2009, now abandoned.

(30) Foreign Application Priority Data

Nov. 28, 2008   (JP) .................................. 2008-305100

(51) Int. Cl.
*H01L 27/02*   (2006.01)
*H01L 27/092*  (2006.01)
(Continued)

(52) U.S. Cl.
CPC .......... *H01L 27/092* (2013.01); *H01L 27/0203* (2013.01); *H01L 27/0207* (2013.01); *H01L 27/085* (2013.01); *H01L 27/105* (2013.01);
(Continued)

(58) Field of Classification Search
CPC .. H01L 27/0203; H01L 27/085; H01L 27/105
USPC .................. 257/206, 208, 368, 379, 390, 401
See application file for complete search history.

(56) References Cited

U.S. PATENT DOCUMENTS 4,651,190 A * 3/1987 Suzuki et al. ................. 257/206
5,185,283 A   2/1993 Fukui et al.
(Continued)

FOREIGN PATENT DOCUMENTS

JP   H07-28013 B    3/1995
JP   H08-097387 A   4/1996
(Continued)

OTHER PUBLICATIONS

Japanese Office Action for JP2008-305100 mailed May 14, 2013. Partial English Language Translation Provided.
(Continued)

*Primary Examiner* — Anh Mai

(57) ABSTRACT

An analog circuit cell array includes a plurality of transistor cell arranged in an array. Each of the transistor cells includes a first source region, a first channel region, a common drain region, a second channel region, and a second source region arranged in sequence one adjacent to another; and a first gate electrode and a second gate electrode formed on the first channel region and the second channel region, respectively, and wherein the first gate electrode and the second gate electrode are connected together for use, and the first source region and the second source region are connected together for use.

14 Claims, 28 Drawing Sheets

(51) Int. Cl.
*H01L 27/105* (2006.01)
*H01L 27/085* (2006.01)
*H01L 27/118* (2006.01)

(52) U.S. Cl.
CPC ... *H01L 27/11803* (2013.01); *H01L 2924/0002* (2013.01)

(56) References Cited

U.S. PATENT DOCUMENTS

| | | | |
|---|---|---|---|
| 5,610,429 A * | 3/1997 | Crafts | 257/401 |
| 5,612,553 A | 3/1997 | Arakawa | |
| 6,069,373 A | 5/2000 | Iwaki | |
| 6,553,553 B2 | 4/2003 | Komaki | |
| 6,555,853 B2 * | 4/2003 | Yokota et al. | 257/202 |
| 6,833,595 B1 * | 12/2004 | Iwasaki | 257/401 |
| 6,881,989 B2 | 4/2005 | Kajii et al. | |
| 7,259,393 B2 | 8/2007 | Chung et al. | |
| 8,194,371 B2 * | 6/2012 | Tang et al. | 361/56 |
| 2003/0222285 A1 * | 12/2003 | Negishi et al. | 257/203 |
| 2007/0152752 A1 * | 7/2007 | Oishi | 330/252 |
| 2010/0133589 A1 | 6/2010 | Aruga et al. | |

FOREIGN PATENT DOCUMENTS

| | | |
|---|---|---|
| JP | H11-8319 A | 1/1999 |
| JP | 2000-260883 A | 9/2000 |
| JP | 2001-177357 A | 6/2001 |
| JP | 2001-358221 A | 12/2001 |
| JP | 2002-368117 A | 12/2002 |
| JP | 2004-281467 A | 10/2004 |
| JP | 2007-36194 A | 2/2007 |

OTHER PUBLICATIONS

USPTO, (MAI) Restriction Requirement, Nov 9, 2011, in parent U.S. Appl. No. 12/617,608 [pending].

USPTO, (MAI) Non-Final Office Action, Feb 21, 2012, in parent U.S. Appl. No. 12/617,608 [pending].

USPTO, (MAI) Final Rejection, Aug 21, 2012, in parent U.S. Appl. No. 12/617,608 [pending].

Huang, Li-Da "A Polynomial Time-Optimal Diode Insertion/Routing Algorithm for Fixing Antenna Problem", IEEE Transactions on Computer-Aided Design of Integrated Circuits and Systems, vol. 23, No. 1 Jan. 2004, 141-147.

Park, Donggun et al.,"A Full-Process Damage Detection Method Using Small MOSFET and Protection Diode", IEEE Electron Device Letters, vol. 17, No. 12 Dec. 1996, 563-565.

Shin, Hyungcheol "Impact of Plasma Charging Damage and Diode Protection on Scaled Thin Oxide", Proc. IEEE International Electron Device Meeting 1993, 18.3.1-18.3.4.

Tuinhout, Hans "Effects of Metal Coverage on MOSFET Matching", Proc. IEEE International Electron Device Meeting 1996, 29.3.1-29.3.4.

English-Language Abstract for Japanese Patent Publication No. 2000-260883 A, published Sep. 22, 2000; 1 page.

* cited by examiner

Prior Art

Prior Art

ANALOG CIRCUIT CELL ARRAY HAVING SOME TRANSISTORS THAT INCLUDE TWO CONNECTED GATE ELECTRODES AND TWO CONNECTED SOURCE REGIONS

CROSS-REFERENCE TO RELATED APPLICATIONS

This application is a Continuation of U.S. patent application Ser. No. 12/617,608, filed on Nov. 12, 2009, now abandoned, which is based upon and claims the benefit of priority of the prior Japanese Patent Application No. 2008-305100, filed on Nov. 28, 2008, the entire contents of which are incorporated herein by reference.

FIELD

The embodiments discussed herein are related to an analog circuit cell array and an analog integrated circuit formed by using an analog circuit cell array.

BACKGROUND

It is known to use a gate array in order to produce a digital integrated circuit having a desired digital circuit with a short lead time. A gate array is a chip on which a large number of basic cells, such as transistors and logic circuit elements, are arranged in an array. By forming an interconnection pattern thereon that matches a user desired digital circuit, the desired digital integrated circuit can be easily produced.

FIG. 1 is a diagram illustrating an example in which an interconnection pattern is formed to interconnect four basic cells in a gate array. In the example of FIG. 1, two PMOS basic cells PMOSC1s and two NMOS basic cells NMOSC1s are arranged in close proximity to each other. Each PMOS basic cell PMOSC1 has a P-type diffusion region PREG1 and two polysilicon gates POLYGs formed on the PREG1. A P-type transistor drain region DRAIN is formed between the two POLYGs, and P-type transistor source regions SOURCEs are formed on the outer sides of the two POLYGs. That is, two PMOS transistors can be formed within this basic cell. Each NMOS basic cell NMOSC1 has an N-type diffusion region NREG1 and two polysilicon gates POLYGs formed on the NREG1. An N-type transistor drain region DRAIN is formed between the two POLYGs, and N-type transistor source regions SOURCEs are formed on the outer sides of the two POLYGs. That is, two transistors can be formed within this basic cell. An N-type diffusion region NREG1 is formed is formed between the adjacent PMOSC1s, while a P-type diffusion region PREG1 is formed between the adjacent NMOSC1s. The gate electrodes POLYGs, drain regions DRAINs, source regions SOURCEs, and inter-device diffusion regions PREG1, NREG1 of the respective basic cells PMOSC1s and NMOSC1s are interconnected by metal interconnect lines METAL1s and contacts CONT1s.

A large number of basic units comprising such PMOSC1s and NMOSC1s are arranged in an array.

In the example of FIG. 1, two transistors can be formed in each of the basic units PMOSC1s and NMOSC1s, but in an alternative example, only one transistor can be formed. The two transistors in each basic unit may be used as transistors that perform the same operation in order to double the driving capability, but alternatively, they can be configured as two independent transistors. When using the transistors to perform the same operation, the drain region is common to the transistors, and the two gate electrodes and the two source regions, respectively, are electrically connected to each other.

On the other hand, when configuring them as two independent transistors, at least either the two gate electrodes or the two source regions are not electrically connected to each other. In this way, the two transistors in each of the basic units PMOSC1s and NMOSC1s are basically formed on the assumption that they are used independently of each other.

Gate arrays for digital circuits are well known, and will not be discussed in detail here.

In recent years, it has been desired to increase the level of integration of analog circuits and to produce them with a short lead time.

A digital circuit need only output or operate with a binary signal having a level falling within a predetermined range and representing a 0 or a 1, and a circuit that operates properly can be easily produced if manufacturing errors are held within prescribed limits. On the other hand, in analog circuits, analog signal values such as voltage values and current values directly affect the circuit operation and output. As a result, analog circuits have had the problem that they are susceptible to differences in device characteristics caused by manufacturing errors. It has therefore been common practice to design each individual analog circuit according to the desired specification and to make adjustments at the manufacturing stage to achieve the production of the desired circuit.

In analog circuits, transistor characteristics differ according to the location of placement, due to such factors as ion implantation profiles and oxide film thickness profiles during manufacturing. A layout scheme called common centroid layout is known for compensating for such differences in characteristics. For example, if there is a difference in the characteristics of two transistors forming a differential pair in a differential amplifier, the error of the analog circuit increases; therefore, the two transistors forming such a differential pair are arranged in a common centroid configuration.

FIG. 2 is a diagram illustrating a common centroid layout example of a differential pair of P-type transistors. The first P-type transistor PMAD1 forming one of the differential pair transistors comprises PMAD1A and PMAD1B, and the second P-type transistor PMAD2 forming the other differential pair transistor comprises PMAD2A and PMAD2B. PMAD1A and PMAD1B are arranged diagonally opposite each other, and PMAD2A and PMAD2B are also arranged diagonally opposite each other, the four transistors thus forming the vertices of a rectangle. The source regions of the four P-type transistors PMAD1A, PMAD1B, PMAD2A, and PMAD2B are connected together by metal interconnect lines NDSA and NDSB on first and second layers, respectively, contacts CONT1s, and plated-through holes VIA1s. The drain regions of the two P-type transistors PMAD1A and PMAD1B are connected to a first output via metal interconnect lines NDD1A and NDD1B, contacts CONT1s, and plated-through holes VIA1s. The drain regions of the two P-type transistors PMAD2A and PMAD2B are connected to a second output via metal interconnect lines NDD2A and NDD2B, contacts CONT1s, and plated-through holes VIA1s. The gate electrodes of the two P-type transistors PMAD1A and PMAD1B are connected to a first input via a metal interconnect line IMOP1 and contacts CONT1s. The gate electrodes of the two P-type transistors PMAD2A and PMAD2B are connected to a second input via a metal interconnect line IPOP1 and contacts CONT1s.

When the two transistors forming the differential pair are each formed from two transistors and arranged in a common centroid configuration, as illustrated in FIG. 2, the difference in the characteristics of the two transistors forming the differential pair can be reduced by compensating for the effects of such factors as ion implantation profiles and oxide film thickness profiles.

Another factor known to adversely affect transistor matching is the antenna effect.

The antenna effect refers to a phenomenon in which, during a process (fabrication process) using a plasma for the fabrication of a MOS transistor, an electrical stress is applied to the gate oxide film of the MOS transistor because of the presence of electric charges in the plasma, leading to a reliability problem or causing the characteristics of the MOS transistor to change. When processing the metal interconnect line connected to the gate oxide film, the metal interconnect line being processed acts as an antenna and gathers electric charges, which can damage the gate oxide film; therefore, this phenomenon is generally called the antenna effect.

It is pointed out that, due to the electric charges gathered by the antenna (the metal interconnect line connected to the gate) during the processing of the metal interconnect line in the plasma process, the threshold voltage Vth of the MOS transistor changes, and matching between the MOS transistors forming a differential pair degrades due to unevenness in the antenna effect.

To alleviate the stress applied to the MOS transistor due to the antenna effect, a method is known in the prior art that inserts a diode called an antenna diode into the gate node of the MOS transistor to be protected.

The antenna diode acts as a current discharge path during the processing of the metal interconnect line in the plasma process, and has the function of preventing possible damage to the gate oxide film. During normal operation after the manufacture, this diode is reverse biased so that it has hardly any effect on the operation, though it induces a small amount of leakage current and an increase in capacitance and area.

It is known that the threshold voltage Vth of a MOS transistor changes when an interconnect line is present above the channel of the transistor than when it is not.

Broken bonds known as dangling bonds exist at the interface between the channel and gate oxide film of the MOS transistor, because the crystal structure abruptly changes across the interface. Since the dangling bonds act as carrier traps, it is desirable to terminate the dangling bonds with hydrogen. If a metal interconnect line is present directly above the channel, it may prevent hydrogen from reaching the channel interface in the annealing step which works to terminate the dangling bonds with hydrogen at the end of the fabrication process. It is therefore desirable that no interconnect lines be provided on MOS transistors that need matching. Otherwise, between the transistors that need matching, the entire structure including the interconnect line above the channel of the MOS transistor must be formed in the same geometry.

RELATED DOCUMENTS

Japanese Laid-open Patent Publication No. H08-97387
Japanese Laid-open Patent Publication No. H11-8319
Japanese Examined Patent Application Publication No. H07-28013
Japanese Laid-open Patent Publication No. 2001-177357

Hyungcheol Shin, Zhi-Jian Ma and Chenming Hu, "Impact of Plasma Charging Damage and Diode Protection On Scaled Thin Oxide," in Proc. IEEE International Electron Device Meeting, pp. 18.3.1-18.3.4, 1993.

Donggun Park, Chenming Hu, Scott Zheng, and Nguyen Bui, "A Full-Process Damage Detection Method Using Small MOSFET and Protection Diode," IEEE ELECTRON DEVICE LETTERS, VOL. 17, NO. 12, pp. 563-565, DECEMBER 1996.

Li-Da Huang, Xiaoping Tang, Hua Xiang, D. F. Wong, and I-Min Liu, "A Polynomial Time-Optimal Diode Insertion/Routing Algorithm for Fixing Antenna Problem," IEEE TRANSACTIONS ON COMPUTER-AIDED DESIGN OF INTEGRATED CIRCUITS AND SYSTEMS, VOL. 23, NO. 1, pp. 141-147, JANUARY 2004.

Hans Tuinhout, Marcel Pelgrom, Red Penning de Vries, Maart en Vertregt, "Effects Of Metal Coverage on MOSFET Matching," in Proc. IEEE International Electron Device Meeting, pp. 29.3.1-29.3.4, 1996.

SUMMARY

According to an aspect of the embodiments, an analog circuit cell array contains a plurality of transistor cells arranged in an array, and enables a desired analog circuit having a high level of integration to be produced with a short lead time by forming an interconnection pattern according to the circuit specification. Each transistor cell includes: a first source region, a first channel region, a common drain region, a second channel region, and a second source region arranged in sequence one adjacent to another; and a first gate electrode and a second gate electrode formed on the first channel region and the second channel region, respectively, and wherein the first gate electrode and the second gate electrode are connected together for use, and the first source region and the second source region are connected together for use.

The object and advantages of the embodiments will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

As described previously, it had been difficult to increase the level of integration of analog circuits, and the lead time for production is also long.

Preferred embodiments will be explained with reference to accompanying drawings. The embodiment disclosed herein achieves an analog circuit that has a high level of integration and that can be produced with a short lead time.

Figure 3:
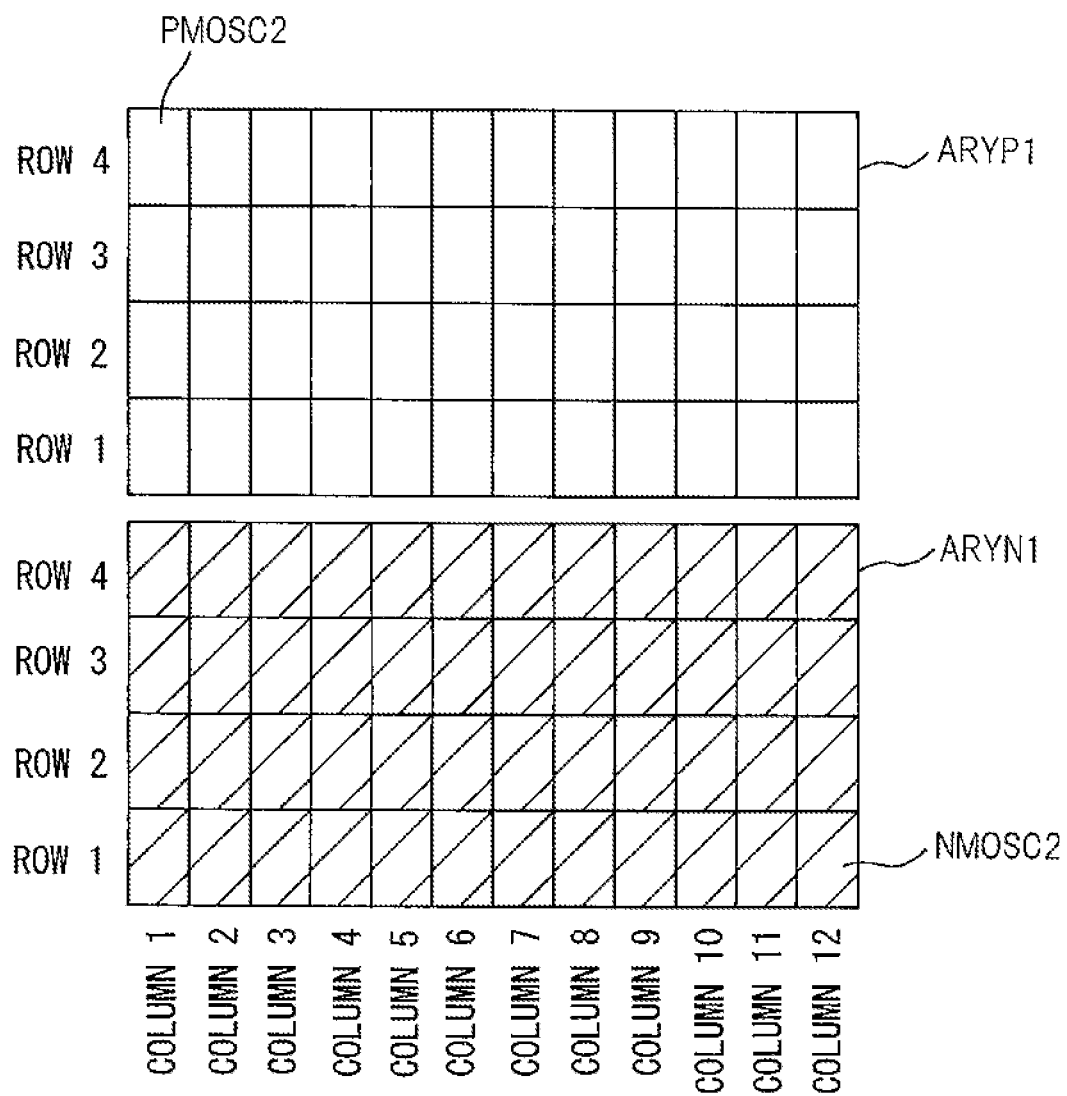
FIG. 3 is a diagram illustrating an arrangement example of PMOS basic cells and NMOS basic cells in an analog circuit cell array according to an embodiment.

FIG. 3 is a diagram illustrating the basic configuration of an analog circuit cell array according to an embodiment. As illustrated in FIG. 3, the analog circuit cell array of the embodiment disclosed herein comprises a PMOS array ARYP1 including PMOS basic cells PMOSC2s arranged in 4 rows and 12 columns, and an NMOS array ARYN1 including NMOS basic cells NMOSC2s arranged in 4 rows and 12 columns. A semiconductor device incorporating this analog circuit cell array further includes input signal terminals, output signal terminals, power supply terminals, etc. plus the circuitry necessary for operating the analog circuit cell array, but these are not illustrated here. A semiconductor device having an analog/digital hybrid circuit can also be implemented by mounting the analog circuit cell array of FIG. 3 in a digital circuit section such as a gate array. A desired analog circuit is achieved by forming interconnection patterns on the 48 PMOS basic cells PMOSC2s and 48 NMOS basic cells NMOSC2s.

As illustrated in FIG. 3, the PMOS array ARYP1 and NMOS array ARYN1 each have four basic cell rows. It is desirable that transistors, such as a pair of transistors forming a differential pair or the like, for which the difference in characteristics needs to be minimized, be implemented using basic cells in the second and third rows. That is, transistors, etc., that require high accuracy are formed using basic cells other than those adjacent to the edges of the PMOS array ARYP1 or NMOS array ARYN1. On the other hand, devices, such as antenna diodes to be described later, that can tolerate relatively large errors in their characteristics can be implemented using the basic cells in the first and fourth rows without causing the problem of accuracy degradation.

If high-accuracy transistors, etc. are to be formed using basic cells other than those adjacent to the edges of the PMOS array ARYP1 or NMOS array ARYN1, and these transistors, etc. are to be arranged in a common centroid configuration, the PMOS array ARYP1 and NMOS array ARYN1 are each required to have four rows and four columns at minimum. However, the number of rows and the number of columns may be increases; for example, a six-row, six-column configuration may be used for each of the PMOS array ARYP1 and NMOS array ARYN1. A simple analog circuit can be achieved using a smaller number of basic cells, but a complex analog circuit requires the use of a large number of basic cells. It is therefore desirable that a plurality of kinds of analog circuit cell arrays having different array configurations be made available for use, with provisions made to be able to select suitable ones according to the analog circuit to be achieved.

Figure 4:
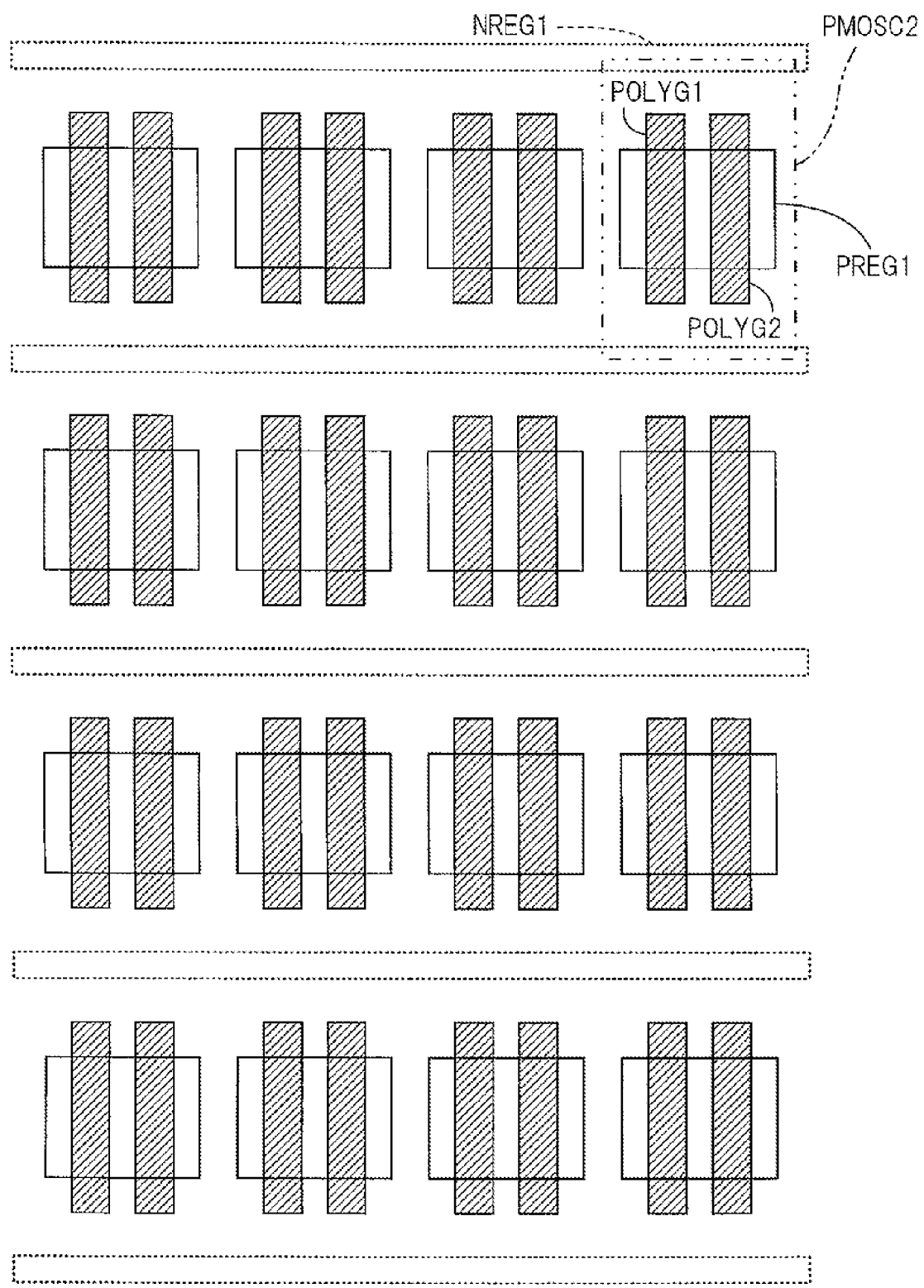
FIG. 4 is a diagram illustrating an arrangement example of gate polysilicon and diffusion layer in a PMOS basic cell in the analog circuit cell array according to the embodiment.

FIG. 4 is a diagram illustrating an arrangement of 4×4 PMOS basic cells PMOSC2s in the PMOS array ARYP1 of FIG. 3. As illustrated in FIG. 4, each PMOS basic cell PMOSC2 has a P-type diffusion region PREG1 and two poly-silicon gate electrodes POLYG1 and POLYG2. Hereinafter, the PREG1 is represented by a rectangular pattern enclosed by solid lines, and each POLYG is indicated by oblique hatching. It should also be understood that unless otherwise specifically stated, the patterns on the same layer are illustrated in the same way and any description once given will not be repeated thereafter. The portions of the P-type diffusion region PREG1 that directly underlie the two polysilicon gate electrodes POLYG1 and POLYG2 are first and second channel regions. The portion of the P-type diffusion region PREG1 that underlies the area between the two polysilicon gate electrodes POLYG1 and POLYG2 is a common drain region. The portions of the P-type diffusion region PREG1 that underlie the area outside the two polysilicon gate electrodes POLYG1 and POLYG2 are first and second source regions. In the illustrated example, each PMOSC2 has an area bounded by double-dashed lines, and such PMOSC2s are arranged in 4 rows and 12 columns, with a continuously formed N-type diffusion region NREG1 located between each row. The width of each of the first and second channel regions is chosen to provide a suitable channel length or gate length, which is, for example, 2 μm. The width of the P-type diffusion region PREG1 defines the channel width or gate width, which is chosen to be, for example, 10 μm. The gate length and gate width are determined in accordance with the specification of the analog circuit, ease of layout, etc. In the following description, the POLYG1 and POLYG2 may sometimes be referred to collectively as POLYG.

Figure 5:
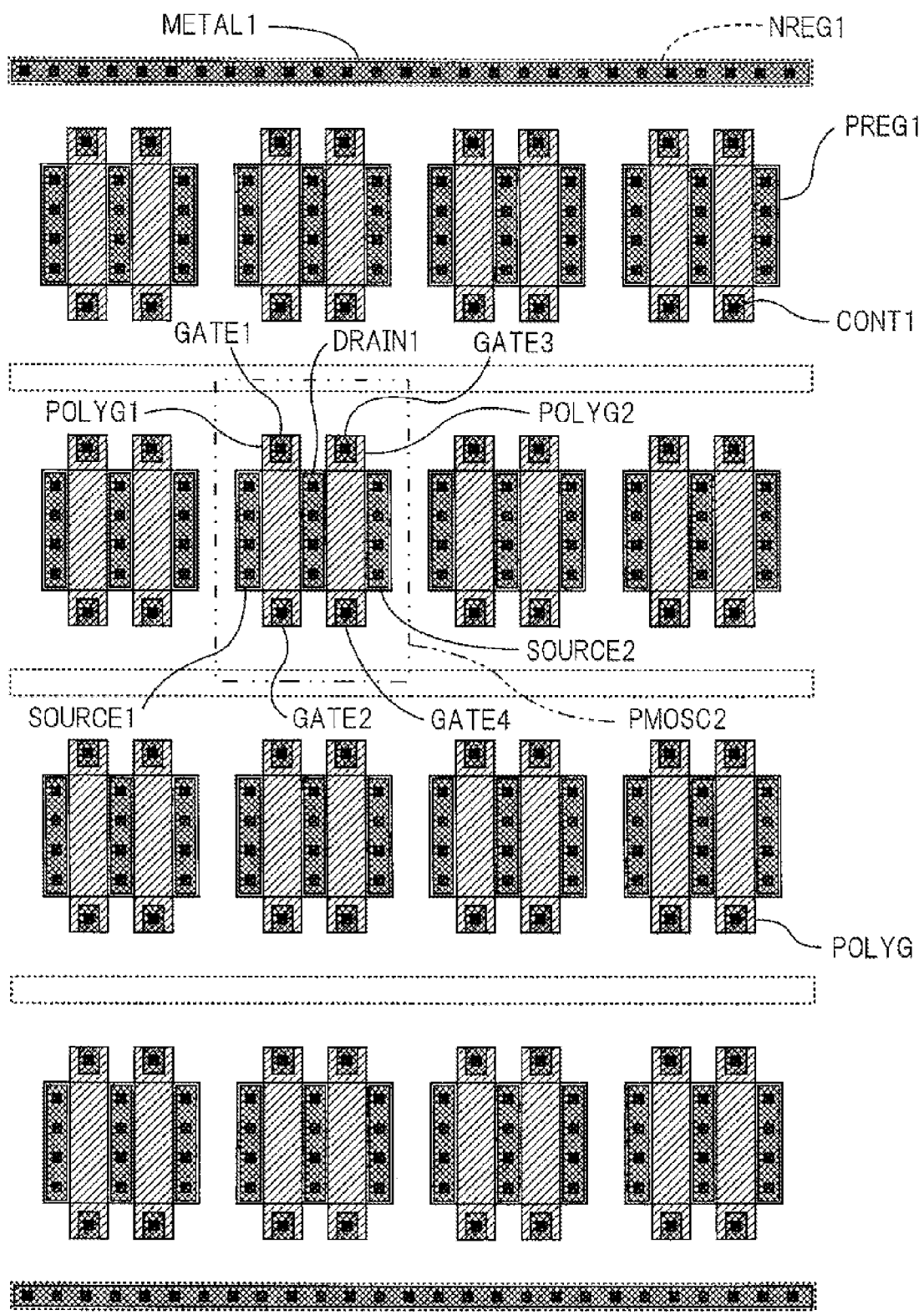
FIG. 5 is a diagram a configuration example of the PMOS basic cells in the analog circuit cell array according to the embodiment.

FIG. 5 illustrates the condition in which a first metal interconnect layer METAL1 is formed in the section including the PMOS basic cells PMOSC2s illustrated in FIG. 4. As will be described later, when actually forming an analog circuit, the polysilicon gate electrodes POLYGs and drain and source regions of each basic cell are connected to the electrodes of the other basic cells, as well as to power supply electrodes, input terminals, output terminals, etc., via the first metal interconnect layer METAL1. However, for simplicity of explanation, the diagram here illustrates the condition in which the connections between the electrodes are not made.

In FIG. 5, the METAL1 is indicated by oblique cross-hatching, and each CONT1 is represented by a square whose vertices are joined by diagonals.

As illustrated in FIG. 5, each PMOS basic cell PMOSC2 has four contacts GATE1, GATE2, GATE3, and GATE4 provided on the upper and lower end portions of the two polysilicon gate electrodes POLYG1 and POLYG2 that extend outwardly of the P-type diffusion region PREG1, a drain electrode DRAIN1 provided on the common drain region in the center, and source electrodes SOURCE1 and SOURCE2 provided on the source regions on both sides. The first metal interconnect layer METAL1 is provided on each of the N-type diffusion regions NREG1s formed along the outer edges of the basic cells in the first and fourth rows, respectively, and is connected to the NREG1. The two polysilicon gate electrodes POLYG1 and POLYG2 and the two source electrodes SOURCE1 and SOURCE2, respectively, are arranged symmetrically to each other with respect to the drain electrode DRAIN1. Two PMOS transistors identical in size are thus formed in the PMOS basic cell PMOSC2. The four contacts GATE1, GATE2, GATE3, and GATE4 are contact portions for connecting the gates of the two PMOS transistors to the METAL1. The DRAIN1 is the common drain electrode of the two PMOS transistors, and the SOURCE1 and SOURCE2 are the source electrodes of the respective PMOS transistors.

In FIGS. 4 and 5, the PMOS basic cells PMOSC2s are the basic units of layout, and there is formed along the boundary between one row of basic cells and the next row of basic cells an N-type diffusion region NREG1 that acts as a back gate electrode of the respective P-type transistors.

As will be described later, the two gate electrodes of each basic cell to be used are connected in common, and the two source electrodes are also connected in common. This achieves in each basic cell the formation of a parallel connection of two transistors whose directions of current are opposite to each other.

In the fabrication process of MOS transistors with ever decreasing feature sizes, a step may be employed that implants ions from an oblique direction. In this case, the width of the area where the high concentration region of the source/drain diffusion layer overlaps the gate electrode can become different, for example, between the right and left sides of the polysilicon gate electrode POLYG. This causes a situation where the effective parasitic resistance differs between the right and left sides of the POLYG. As a result, a situation occurs where the characteristics of the MOS transistor become different when the source is formed in the diffusion layer on the right side of the POLYG and the drain in the diffusion layer on the left side than when the source is formed in the diffusion layer on the left side of the POLYG and the drain in the diffusion layer on the right side. Because of such characteristics of the fabrication process, the device geometry and the method of using the device, including the direction in which the current flows, must be made to match between the transistors that need matching. Matching the device characteristics, including the threshold voltage Vth and drain current, will hereinafter be referred to as matching.

However, the direction of current at the time of layout cannot be checked by software called LVS or DRC that is used to check circuit interconnections. The reason is that, in order to check the direction in which the current flows in the MOS transistor, a full understanding of the complex circuit becomes necessary which involves understanding the circuit operation and recognizing the devices that need matching. As a result, it has been the prior practice to manually check the sameness of the device arrangement, including the direction of current.

Accordingly, in such cases as where, when the source and drain of a single MOS transistor are interchanged, the device characteristics change and the effective parasitic resistance, for example, is different between the source and drain, it is desirable to secure the symmetry by also considering the direction of current.

In the layout of FIG. 5, by configuring the PMOS basic cell PMOSC2 into two PMOS transistors having the drain in common, two transistors whose directions of current flowing from source to drain are opposite to each other can be formed within the basic cell. As a result, when the basic cells are arranged, for example, in a common centroid configuration with each basic cell as a unit, the total currents flowing in the transistors having different current directions are automatically added together, offering the effect that the mismatching between the MOS transistors having different current directions can be compensated for without having to consider the direction of current in each basic cell.

Further, by constructing the PMOS basic cell PMOSC2 so as to include the N-type diffusion region NREG1 acting as the PMOS back gate electrode and also include a substrate or well-feeding diffusion region in the basic cell structure, the need to separately provide a region for feeding N-type wells can be eliminated.

When the basic unit is configured as a parallel connection of two transistors whose directions of current are opposite to each other, the advantage of being able to eliminate the need to consider or examine the direction of current in detail can be obtained, as long as the basic cell structure illustrated in FIG. 5 is observed. That is, the possibility of overlooking the differences in characteristics due to the difference in current direction can be reduced to zero.

If the offset current is to be minimized in an analog circuit, the characteristics of the transistors to be used must be made to match as much as possible. To avoid the effects of nonuniformity in resist exposure or etching, it has been general practice to use MOS transistors of identical geometry and to place dummy devices around the devices that need accuracy. However, in recent MOS transistors with ever decreasing feature sizes, a stress may be deliberately applied to the channel region in order to increase the current driving capability, and from this fact, it can be seen that a change in mobility due to the difference in stress induced by the device isolation region cannot be ignored. Since trench-type isolation structures are often employed, the formation and arrangement of devices must be considered so that the factors affecting the stress applied to the MOS transistor channel region, such as the geometry of the isolation region, the geometry of the source/drain electrodes, and their ratio to the isolation region, become the same for all the devices.

Even in a structure in which PMOS transistors of identical geometry are arranged in a repeated fashion, an N-type well-feeding region inevitably becomes necessary somewhere in the structure. The present inventors have discovered that when the N-type well-feeding region is placed, for example, in the outermost portion of the structure in which PMOS transistors are arranged in a repeated fashion, the well feeding region itself disrupts the sameness of the isolation region. That is, it is preferable to repeat the same geometry including the well-feeding region, because then the symmetry and sameness of the transistor structure, including the isolation region, can be ensured. There is thus a need to devise the basic transistor cell structure and interconnect structure that can achieve such symmetry.

The layout of FIG. 5 achieves the structure in which the same geometry, including the well-feeding region, is repeated, while allowing interconnects to be made to the devices. In the structure illustrated in FIG. 5, the PMOS basic cells PMOSC2s are arranged in a repeated fashion, including the N-type well-feeding regions NREG1s. That is, the basic cells PMOSC2s such as the one bounded by the double-dashed lines are repeated in vertical and horizontal directions, and the NREG1 is shared between the upper and lower cells. This is illustrated by the fact that the double-dashed lines defining the upper and lower bounds of the PMOS basic cell PMOSC2 are drawn along the centerlines of the respective N-type well-feeding regions NREG1s. This cell structure (basic structure) ensures the symmetry and sameness of the transistor structure, including the isolation region, and offers the effect of minimizing the difference in the stress applied to the channel region. This serves to further increase the degree of matching in mobility.

Further, by providing the four contacts GATE1, GATE2, GATE3, and GATE4 in advance in such a manner that each contact can be connected to the METAL1 independently of the others, it becomes possible to feed power to the gates from any direction, while also achieving the effect of enhancing the orderliness of the gate interconnect regions.

Figure 6:
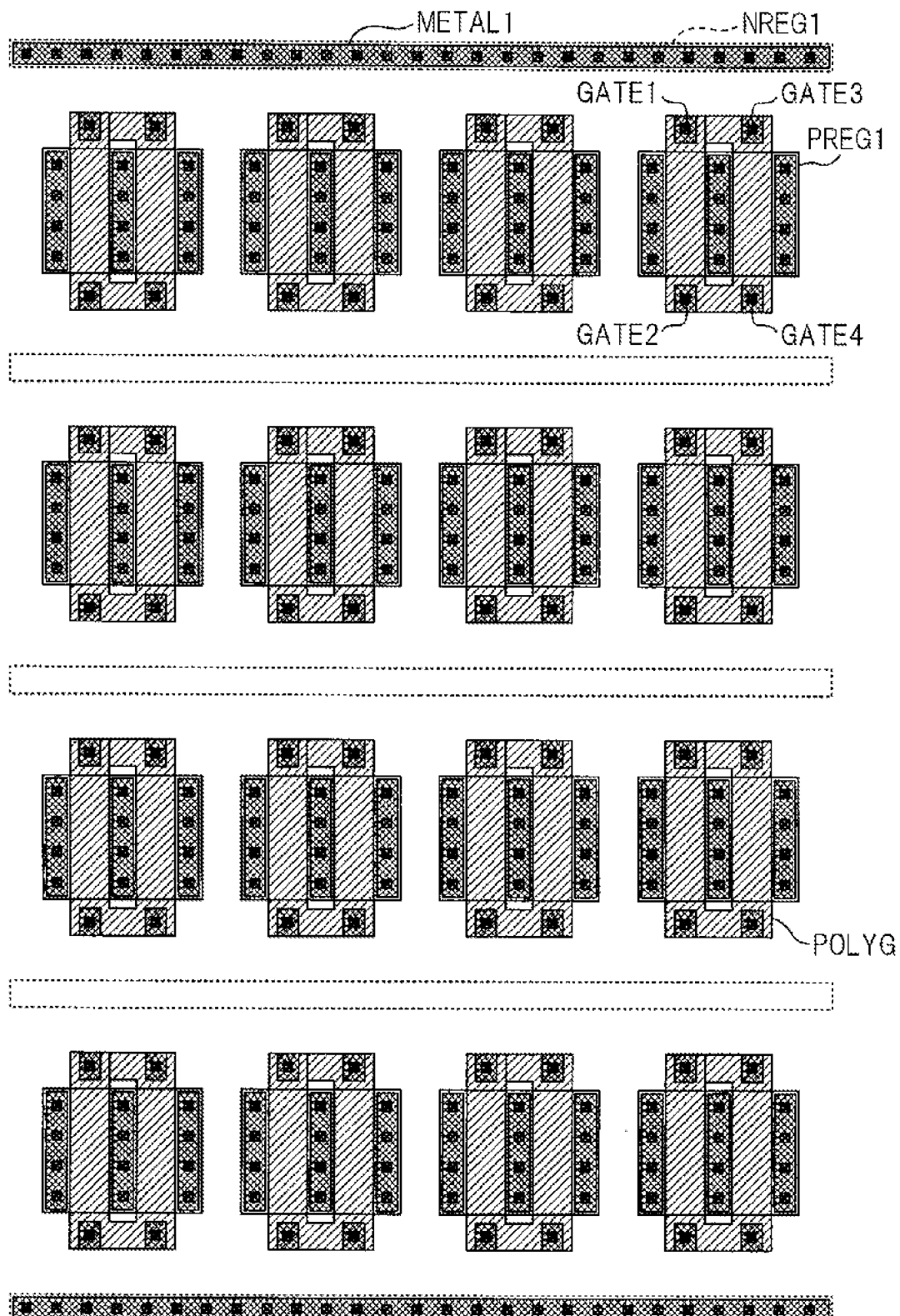
FIG. 6 is a diagram a configuration example of the PMOS basic cells in the analog circuit cell array according to the embodiment.

As described earlier, the two gate electrodes of each basic cell to be used are connected together. Therefore, the two polysilicon gate electrodes POLYGs of each basic cell illustrated in FIG. 4 may be formed connected together. FIG. 6 illustrates the condition in which the first metal interconnect layer METAL1 is formed on the basic cell polysilicon gate electrodes POLYGs formed connected together.

The structure illustrated in FIG. 5 in which the two transistors have independent gates leaves room for the possibility that when there is no need to care about the direction of current flow as in powerdown devices, for example, the transistors can be used as two independent transistors by interchanging the source and drain electrodes. However, in view of the basic constitution of connecting the two transistors of different currents in parallel within each basic cell, the two gates may be connected directly by a POLYG interconnect line within the basic cell, as illustrated in FIG. 6. Considering the fact that it is desirable to arrange the interconnect lines as symmetrically as possible and the possibility that the circuit can be changed by changing only the interconnect lines, four contacts should be provided for connecting the POLYGs to the METAL1; since potentials can be supplied and coupled to the gates within each basic cell by just making connections to the four gate/METAL1 connecting portions, this achieves the effect of increasing design freedom in bringing out the signal interconnect lines.

Interconnects in the analog circuit cell array according to the embodiment will be described below.

It is known that the threshold voltage Vth of a MOS transistor changes when an interconnect line is present above the channel of the transistor than when it is not. Broken bonds called dangling bonds exist at the interface between the channel and gate oxide film of the MOS transistor, because the crystal structure abruptly changes across the interface. Since the dangling bonds act as carrier traps, it is desirable to terminate the dangling bonds with hydrogen. If a metal interconnect line is present directly above the channel, it may prevent hydrogen from reaching the channel interface in the annealing step which works to terminate the dangling bonds with hydrogen at the end of the fabrication process. It is therefore desirable that no interconnect lines be provided on MOS transistors that need matching. Otherwise, between the transistors that need matching, the entire structure including the interconnect line above the channel of the MOS transistor must be formed in the same geometry.

To prevent the threshold voltage Vth of the transistor from changing, it is required in the layout of FIG. 5 that no interconnect lines be provided above the regions where the two polysilicon gates POLYGs overlap the P-type diffusion region PREG1, that is, above the channel regions in each of which an inversion layer in the transistor is formed.

Figure 7A:
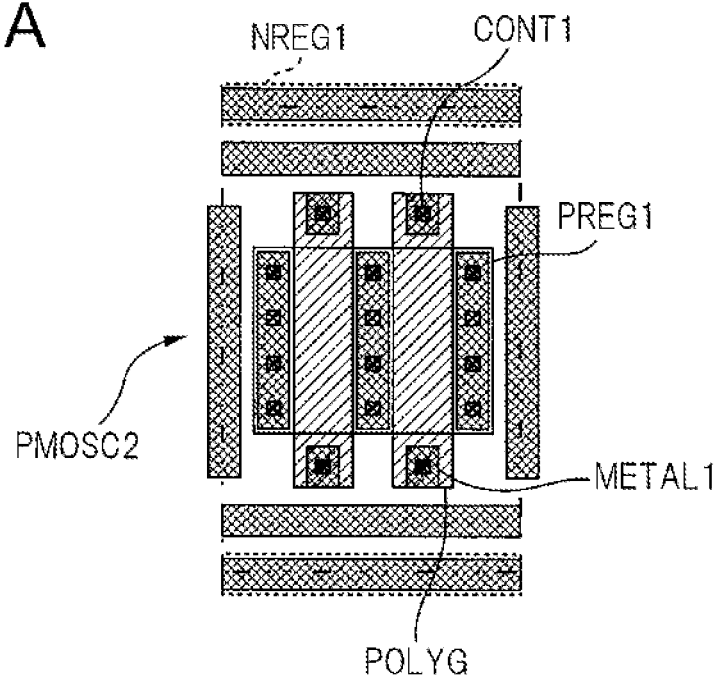
FIGS. 7A and 7B are diagrams explaining interconnect regions formed in each PMOS basic cell in the analog circuit cell array according to the embodiment.
Figure 7B:
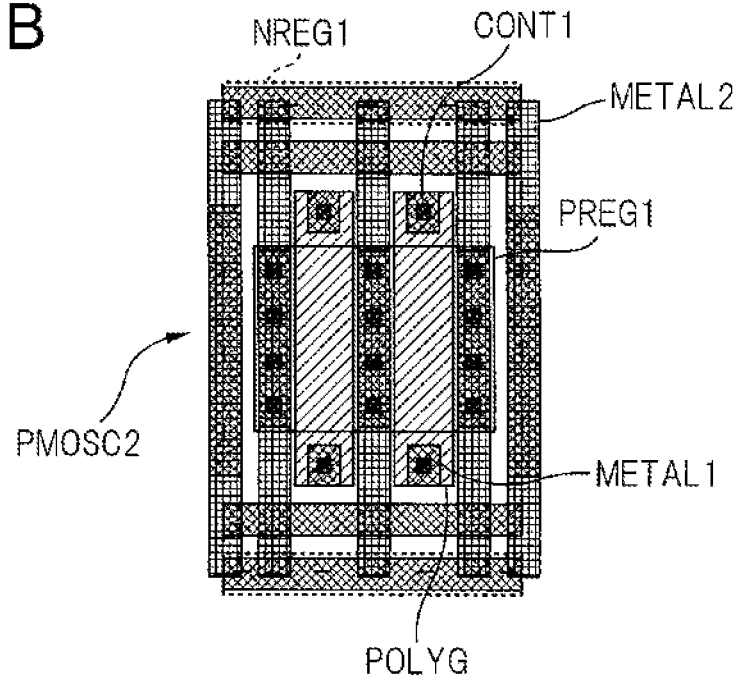

FIGS. 7A and 7B are diagrams illustrating an example of how interconnects are formed in the PMOS basic cell PMOSC2. FIG. 7A illustrates the condition in which the first metal interconnect layer METAL1 is formed, and FIG. 7B illustrates the condition in which a second metal interconnect layer METAL2 is formed. As illustrated in parts (A) and (B) of FIG. 7, the PMOS basic cell PMOSC2 includes at least three interconnect channels formed on the first metal interconnect layer METAL1 in the lateral direction (current path direction). That is, it includes two lateral METAL1 interconnect channels within the basic cell structure and one lateral METAL1 interconnect channel which is shared with an adjacent basic cell (since it is shared, 0.5+0.5=1). In some cases, five lateral METAL1 interconnect channels may be provided within the basic cell structure. Anyway, no interconnect lines are provided above the current channels of the PMOS transistors.

Further, the PMOS basic cell PMOSC2 includes at least four interconnect channels formed on the second metal interconnect layer METAL2 in the longitudinal direction (gate width direction). That is, it includes three longitudinal METAL2 interconnect channels within the basic cell structure and one longitudinal METAL2 interconnect channel which is shared with an adjacent basic cell. The three longitudinal METAL2 interconnect channels within the basic cell structure are provided above the drain electrode and source electrodes (METAL1) of the basic cell PMOSC2. In some cases, six METAL2 interconnect channels may be provided within the basic cell structure. The region underneath the longitudinal METAL2 interconnect channel shared with the adjacent basic cell can also be used for the formation of a longitudinal METAL1 interconnect line.

By providing two lateral METAL1 interconnect channels formed on the first metal interconnect layer METAL1 in the lateral direction (current path direction) within the basic cell structure and one lateral METAL1 interconnect channel shared with the adjacent basic cell, as described above, two lateral signal interconnect lines can be formed in addition to the interconnect line for well-feeding.

Furthermore, since the basic cell structure comprises a common drain and two independent source electrodes, five nodes, i.e., the two sources, the drain, the gate, and the well, must be connected using METAL1 interconnects. To achieve this, an interconnect channel other than the METAL1 at the gate/POLY contacts becomes necessary. To maintain the symmetry of the cell structure, an even number of METAL1 interconnect channels must be provided in addition to the METAL1 interconnect channel shared with the adjacent cell.

Further, by providing the METAL1 interconnect channels avoiding the portions above the current channels through which the current of the MOS transistor flows (the portions where the POLYGs overlap the PREG1), it is possible to achieve the structure in which no metal interconnect lines are provided above the gate channels; this prevents Vth from changing due to the presence of the metal interconnect line, and serves to enhance the relative accuracy.

Likewise, by providing the METAL2 interconnect channels above the drain electrode and source electrodes (METAL1) of the basic cell PMOSC2, that is, by providing the interconnect channels on the second metal interconnect layer METAL2 in the longitudinal direction (gate width direction), i.e., three longitudinal METAL2 interconnect channels within the basic cell structure and one longitudinal METAL2 interconnect channel shared with an adjacent basic cell, it is possible to secure regions where the four longitudinal signal interconnect lines can be formed.

By providing the METAL2 interconnect channels avoiding the portions above the current channels through which the current of the MOS transistor flows (the portions where the POLYG overlap the PREG1), it is possible to achieve the structure in which no metal interconnect lines are provided above the current channels; this prevents Vth from changing due to the presence of the metal interconnect line, and serves to enhance the relative accuracy. Then, by providing the METAL2 interconnect channels above the drain electrode and source electrodes of METAL1 so as to avoid the portions above the current channels through which the current of the MOS transistor flows, and providing the channel shared with the adjacent cell, the symmetry of the cell structure can be maintained.

Figure 8:
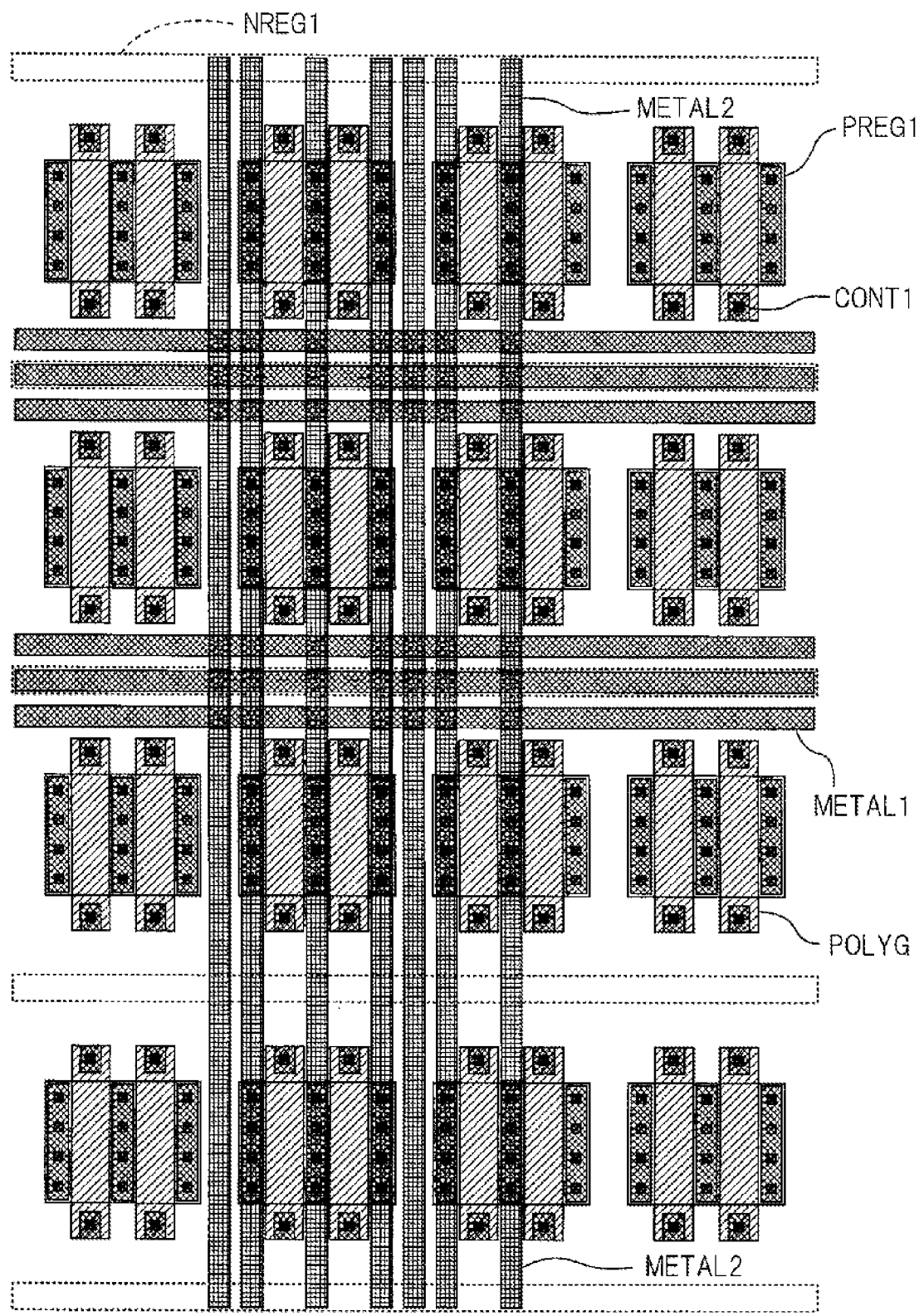
FIG. 8 is a diagram explaining interconnect regions formed in the analog circuit cell array according to the embodiment.

FIG. 8 is a diagram explaining the basic constitution of the interconnect channels in the layout of the embodiment; here, the longitudinally extending interconnect lines and the laterally extending interconnect lines are illustrated as being the interconnect lines that can be formed irrespective of the circuit connections.

Since no interconnect lines are allowed to be formed above the current channel regions of the PMOS transistors, the METAL2 interconnect lines extend in the longitudinal direction. Four interconnect lines, i.e., the inter-cell longitudinal interconnect line shared between adjacent PMOS basic cells PMOSC2s and the interconnect lines formed above the source and drain electrodes, are the longitudinal METAL2 interconnect lines that can be provided in each column. As for the lateral METAL1 interconnect lines, the interconnect line on the NREG1 and the lateral interconnect lines in the gap between the NREG1 and the gate contact region are the lateral METAL1 interconnect lines that can be formed. That is, in the illustrated structure, three lateral METAL1 interconnect lines can be provided in each basic cell row. The interconnect channel on the NREG1 is shared between the longitudinally adjacent cells.

From the standpoint of feeding VDD to the NREG1, it is desirable in principle that the NREG1 interconnect line be formed as a VDD interconnect line, but if necessary, it is used not as a VDD but as a signal interconnect line in a specific region. Taking advantage of the fact that VDD need not necessarily be fed from the METAL1 in all the regions of the NREG1, the METAL1 interconnect line in a given region on the NREG1 can be used as a signal interconnect line. Further, in the case of the P-type basic cell, the interconnect line on the NREG1 is a VDD interconnect line as a general rule, but if necessary, it can be used locally as a signal interconnect line. The METAL1 interconnect lines illustrated extending longitudinally along the right and left edges of the basic cell indicate that the regions directly beneath the longitudinal METAL2 interconnect lines can also be used as METAL1 interconnect regions. Or, the cell structure is designed so that the right and left boundaries of the cell can be used as longitudinal METAL1 interconnect regions. When the cell structure is employed that allows the METAL1 interconnect lines to pass through the cell boundary regions so that signals can be passed in the longitudinal direction, there is offered the effect that the antenna diode can be connected as will be described later.

While the configuration of the section including 4×4 PMOS basic cells PMOSC2s in the PMOS array ARYP1 has been described above, it will be appreciated that the configuration is the same for the corresponding section including 4×4 NMOS basic cells NMOSC2s in the NMOS array ARYN1, except that the polarity of the diffusion layer is inverted, and therefore, a diagrammatic illustration and description thereof will not be given herein.

Next, a description will be given of an embodiment for forming a bandgap circuit of a series regulator by using the analog circuit cell array of the embodiment described above.

A microcomputer (MCU) is used as a programmable component in an electronic apparatus. With advances in semiconductor processing technology, i.e. miniaturization technology, the range of applications of MCUs has been increasing at a rapid pace. The reason is that, with advances in miniaturization technology, the processing capabilities of the MCUs have been improving and the cost per function has been decreasing. As device geometries decrease, the voltage withstanding capabilities of microstructure transistors forming digital circuits have been decreasing. For example, supply voltage for a CMOS circuit with a gate length of 0.18 µm is generally on the order of 1.8 V. On the other hand, in automotive applications, for example, it is often the case that the interface voltage to the MCU is required to satisfy the traditional 5-V specification. There are also cases where the supply voltage or interface voltage supplied from outside the MCU is required to be 5 V, while on the other hand, 1.8 V needs to be used as the supply voltage to digital circuitry due to the voltage withstanding capabilities of the internal circuitry. In such cases, to reduce the number of external components it is standard practice to equip the MCU with a series regulator which generates 1.8-V power from the externally supplied 5-V power and supplies the 1.8-V power to the internal digital circuitry.

Figure 9:
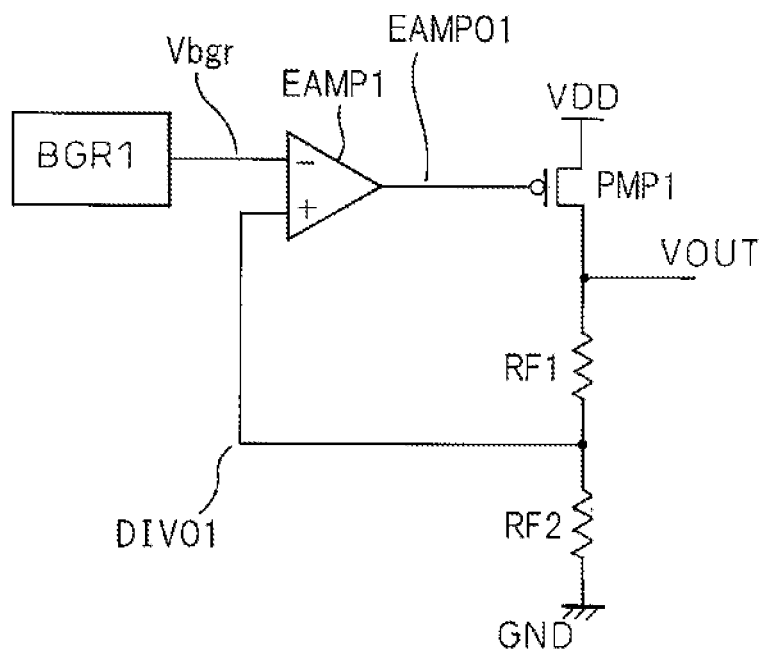
FIG. 9 is a diagram illustrating a circuit example of a regulator circuit related to the embodiment.

FIG. 9 is a diagram illustrating one example of the series regulator circuit, illustrating a typical configuration of a series regulator which generates 1.8-V power from the externally supplied 5-V power. The series regulator includes a bandgap circuit BRG1 for generating a reference voltage, an error amplifier EAMP1, an output transistor PMP1, and a resistive voltage-dividing circuit for dividing the regulator output voltage. The resistive voltage-dividing circuit includes resistors RF1 and RF2 between which the regulator output voltage is divided. In FIG. 9, Vbgr represents the reference voltage that the bandgap circuit BRG1 outputs, while EAMPO1 designates the output of the error amplifier EAMP1, VOUT the regulator output, DIVO1 the output of the resistive voltage-dividing circuit, VDD the 5-V power supplied, for example, from the outside, and GND the ground potential (0 V). In the following description, the device name beginning with R indicates a resistor, and the device name beginning with PM indicates a PMOS transistor.

In the regulator circuit of FIG. 9, the bandgap circuit BRG1 generates the bandgap voltage Vbgr (1.2 V), i.e., the reference voltage that does not depend on temperature or supply voltage. The resistive voltage-dividing circuit of RF1 and RF2 generates a divided voltage by dividing the regulator output voltage VOUT, for example, at ⅔. With the error amplifier EAMP1 controlling the gate of the output transistor PMP1, negative feedback control is performed so that the output of the resistive voltage-dividing circuit, DIVO1, becomes identical with the reference voltage (bandgap voltage) Vbgr (1.2 V).

Since the voltage DIVO1, which is equal to the regulator output multiplied by ⅔, is identical with the bandgap voltage Vbgr (1.2 V), the regulator output voltage VOUT, for example, is controlled to the constant voltage of 1.8 V (ideally) despite variations in temperature, supply voltage, and load current.

Ideally, the bandgap voltage is about 1.2 V and is independent of temperature and supply voltage, but in practice, its output voltage changes from circuit to circuit due to such factors as variations in the MOS transistor used to form the CMOS bandgap circuit. In a typical CMOS bandgap circuit, the output voltage varies within a range of ±8% of 1.2 V.

If the reference voltage Vbgr is, for example, 1.2 V±8%, then in the above example the regulator output voltage VOUT is also 1.2 V±8% (disregarding the offset voltage of the error amplifier), which is 1.2 V±140 mV if the variation range is expressed in terms of absolute value. This means that the regulator output voltage VOUT fluctuates within a range of 1.66 V to 1.94 V around 1.8 V.

Since the regulator output voltage VOUT provides a supply voltage to a logic circuit formed from a CMOS circuit with a gate length of 0.18 μm, it follows that in one sample, the supply voltage to the MCU logic circuit may be 1.66 V, while in another sample, the supply voltage to the MCU logic circuit may be 1.94 V.

If the supply voltage to the MCU logic circuit is low, the delay time of the basic circuit forming the logic circuit increases, which is disadvantageous from the viewpoint of operating frequency. On the other hand, it is desired to hold the upper limit of the supply voltage to the MCU logic circuit, for example, within 2.0 V from the standpoint of device reliability (for example, TDDB (Time-Dependent Dielectric Breakdown), hot carrier degradation, etc.).

If the error of the regulator output voltage is large, it becomes difficult to satisfy the upper limit of the supply voltage determined from the standpoint of reliability, while at the same time satisfying the lower limit of the supply voltage that the regulator outputs and that is determined by the operating speed requirement.

In view of the above situation, it is required, for example, in the regulator circuit that the output voltage accuracy of the bandgap circuit be improved as much as possible.

Figure 10:
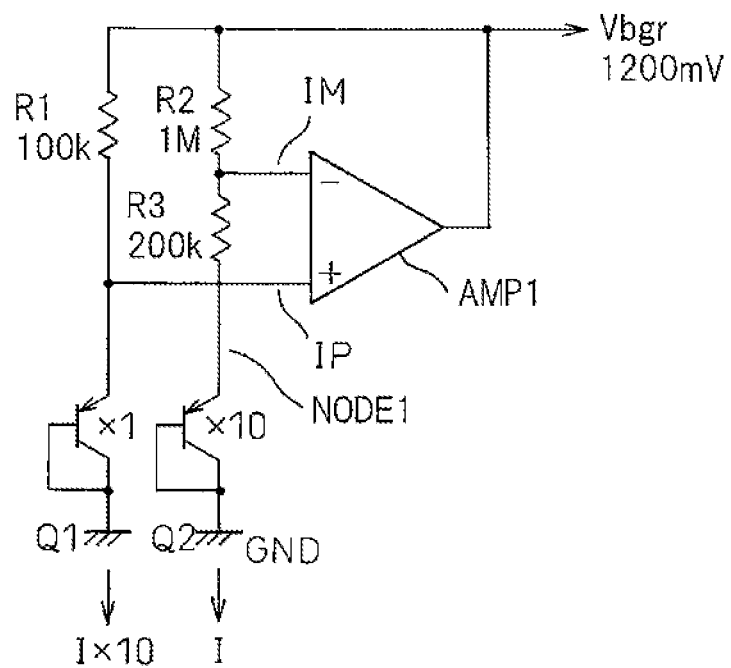
FIG. 10 is a diagram illustrating a circuit example of a bandgap circuit (BGR circuit) contained in the regulator circuit.

FIG. 10 illustrates one example of the bandgap circuit. In an analog integrated circuit, a reference voltage circuit called a bandgap circuit is widely used when a reference voltage independent of temperature and supply voltage is needed. Since it can be easily combined with a digital circuit, the bandgap circuit is also widely used as a stable reference voltage circuit in many important CMOS analog integrated circuits.

Various kinds of circuits that obtain a temperature-independent reference voltage by adding a forward biased pn junction voltage to a voltage proportional to absolute temperature (T) (generally called PTAT—Proportional To Absolute Temperature) have been devised and commercially implemented as bandgap circuits. It is known that the forward biased pn junction voltage (if approximated by a linear equation, or in the range where it can be approximated by a linear equation) is CTAT (Complementary To Absolute Temperature, that is, negatively linearly dependent on absolute temperature). It is known that by adding a (suitable) PTAT voltage to this forward biased pn junction voltage, a reference voltage virtually independent of temperature can be obtained.

FIG. 10 illustrates a typical circuit example of such a bandgap circuit. In FIG. 10, Q1 and Q2 are pnp bipolar transistors (hereinafter abbreviated pnp BJTs), R1, R2, and R3 are resistors (their values are also designated by R1, R2, and R3), AMP1 is an operational amplifier circuit, GND is a GND terminal, Vbgr is the output reference voltage, and NODE1, IM, and IP are internal nodes. The values illustrated alongside the resistors are examples of the resistance values, and the number affixed to each BJT indicates the relative area ratio of the BJT.

The operation of the bandgap circuit of FIG. 10 will be explained briefly. It is known that, denoting the base-emitter voltage of the BJT or the pn junction forward bias voltage by Vbe, the relationship between the pn junction forward bias voltage and absolute temperature is roughly given by the following equation (1).

$$Vbe = Veg - aT \qquad (1)$$

(Vbe: pn junction forward bias voltage, Veg: silicon bandgap voltage which is about 1.2 V, a: temperature dependence of Vbe which is about 2 mV/° C., T: absolute temperature) (The value of a varies depending on the bias current, but it is known to be about 2 mV/° C. in the operating range.)

It is also known that the relationship between the emitter current IE of the BJT and the voltage Vbe is roughly given by the following equation (2).

$$IE = IO \exp(qVbe/kT) \qquad (2)$$

(IE: emitter current of BJT or diode current, IO: constant (proportional to area), q: electron charge, k: Boltzmann constant)

By the negative feedback action of the operational amplifier AMP1, when the voltage gain of the AMP1 is sufficiently large, the voltages at the inputs IM and IP to the AMP1 become substantially identical with each other and the circuit stabilizes. In this case, if the ratio of R1 to R2 is, for example, chosen to be 1:10 (100 k:1 M) as illustrated in FIG. 10, then the ratio of the magnitude of the current flowing through Q1 to that through Q2 is 10:1, hence the current flowing through Q1 is designated by 10I and that through Q2 by I. (I×10 and I illustrated below Q1 and Q2 indicate the relationship between these currents.)

If the emitter area of Q2 is 10 times the emitter area of Q1 (×1 and ×10 affixed to Q1 and Q2 in FIG. 10 indicate the relationship between these emitter areas), and the base-emitter voltage of Q1 is denoted by Vbe1 and the base-emitter voltage of Q2 by Vbe2, then from the equation (2) it can be seen that the relations expressed the following equations (3) and (4) hold.

$$10 \times I = IO\exp(qVbe1/kT) \quad (3)$$

$$I = 10 \times IO\exp(qVbe2/kT) \quad (4)$$

Dividing both sides of (3) by both sides of (4) and denoting Vbe1−Vbe2 as ΔVbe, the following equations (5) and (6) are obtained.

$$100 = \exp(qVbe1/kT - qVbe2/kT) \quad (5)$$

$$\Delta Vbe = (kT/q)\ln(100) \quad (6)$$

That is, the difference ΔVbe between the base-emitter voltages of Q1 and Q2 is expressed by the logarithm (ln(100)) of the Q1/Q2 current density ratio 100 and the thermal voltage (kT/q). Since this ΔVbe is equal to the potential difference across the resistor R3, the current of ΔVbe/R3 flows through the resistors R2 and R3.

Therefore, the potential difference VR2 across the resistor R2 is expressed by the following equation (7).

$$VR2 = \Delta Vbe R2/R3 \quad (7)$$

Since the voltage at IP and the voltage at IM are both equal to Vbe1, the reference voltage Vbgr is expressed by the following equation (8).

$$Vbgr = Vbe1 + \Delta Vbe R2/R3 \quad (8)$$

The pn junction forward bias voltage Vbe1 has negative temperature dependence and decreases with increasing temperature (equation (1): Vbe=Veg−Ta), while on the other hand, ΔVbe increases with increasing temperature as illustrated by the equation (6). By suitably selecting the constant, the circuit can be designed so that the value of the reference voltage Vbgr becomes temperature independent. The value of Vbgr in that case is about 1.2 V (1200 mV) which corresponds to the silicon bandgap voltage.

In this way, by suitably selecting the circuit constant in the circuit of FIG. 10, the temperature independent bandgap voltage can be generated using relatively simple circuitry.

While the circuit of FIG. 10 has the advantage that the reference voltage can be generated using relatively simple circuitry as described above, it also has a shortcoming as will be described below.

Figure 11:
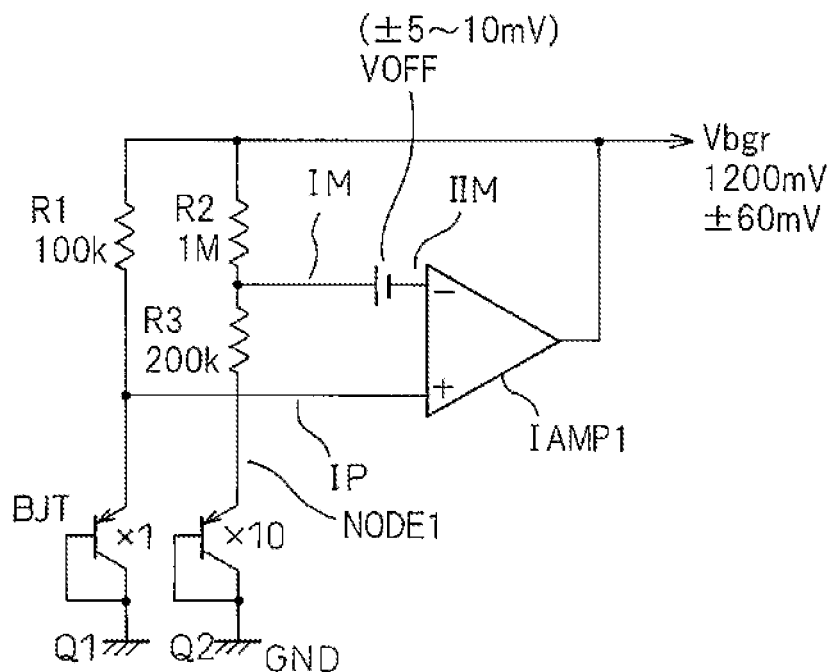
FIG. 11 is a diagram explaining the relationship between the offset voltage and output voltage of the bandgap circuit (BGR circuit)

FIG. 11 illustrates the problem associated with the circuit of FIG. 10.

In FIG. 11, Q1 and Q2 are pnp bipolar transistors (hereinafter abbreviated pnp BJTs), R1, R2, and R3 are resistors (their values are also designated by R1, R2, and R3), IAMP1 is an ideal operational amplifier circuit, GND is a GND terminal, Vbgr is the output reference voltage, NODE1, IM, and IP are internal nodes, VOFF is an equivalent voltage source which represents the offset voltage of the operational amplifier, and IIM is a negative input terminal of the ideal operational amplifier IAMP1. The values illustrated alongside the resistors are examples of the resistance values, and the number affixed to each BJT indicates the relative area ratio of the BJT.

To explain the problem associated with the circuit of FIG. 10, the AMP1 in FIG. 10 is illustrated in FIG. 11 by the ideal operational amplifier IAMP1 and the equivalent offset voltage VOFF. Since the basic operation has already been described with reference to FIG. 10, a description will be given below of how the offset voltage VOFF affects the output voltage Vbgr.

In a CMOS circuit, when forming a bandgap circuit, especially one such as illustrated in FIG. 10, the effect of the operational amplifier offset voltage is unavoidable. Ideally, when the input voltages IM and IP to the AMP1 of FIG. 10 are identical, the AMP1 produces an output voltage substantially equal to (for example) one half of the supply voltage. However, in a practical integrated circuit, since the characteristics of the devices forming amplifiers are not perfectly identical, the input voltages with which the output voltage of the AMP1 becomes substantially equal to (for example) one half of the supply voltage differ for each individual amplifier, and the difference between the input voltages at that time is called the offset voltage. It is known that a typical offset voltage is about ±10 mV.

To explain how the characteristics of the practical amplifier affect the output voltage of the bandgap circuit, the AMP1 in FIG. 10 is illustrated in FIG. 11 by the ideal operational amplifier IAMP1 and the equivalent offset voltage VOFF. Here, the offset voltage of the ideal operational amplifier IAMP1 is 0 mV.

In the ideal circuit of FIG. 10, the voltages IM and IP are identical. On the other hand, in the practical circuit, since the input voltages IIM and IP to the virtual ideal operational amplifier are identical, the voltages IM and IP differ by an amount equal to the offset voltage VOFF. For simplicity, the potential difference that would occur under an ideal condition across the resistor R3 is expressed by the following equation (9).

$$VR3 = \Delta Vbe \quad (9)$$

The potential difference VR3' across the resistor R3 in FIG. 11 is expressed by the following rough equation (9'). (It is to be understood that VOFF indicates the value of the offset voltage VOFF.)

$$VR3' = \Delta Vbe + VOFF \quad (9')$$

The potential difference VR2' across the resistor R2 is expressed by the following equation (10).

$$VR2' = (\Delta Vbe + VOFF)R2/R3 \quad (10)$$

Hence, Vbgr is expressed by the following equation (11).

$$Vbgr = Vbe1 + VOFF + (\Delta Vbe + VOFF)R2/R3 \quad (11)$$

If it is assumed that R2/R3=5 as illustrated in FIG. 3, the value of Vbgr is equal to the sum of the ideal value and the offset value multiplied by (about) 6.

In the circuit examples illustrated in FIGS. 10 and 11, in order to minimize the effect of the offset voltage of the operational amplifier, the area of Q2 is set to be 10 times that of Q1 and the current flowing through Q1 is set to be 10 times the current flowing through Q2. Accordingly, the potential difference across R3, for example, is given by the following equation (12).

$$\Delta Vbe = (kT/q)\ln(100) = 26 \text{ mV} \times 4.6 = 120 \text{ mV} \quad (12)$$

As illustrated by the equation (12), the potential difference can be made relatively large at 120 mV. The effect of VOFF can be held relatively low in this way but, even in this case, if the bandgap voltage of 1200 mV is to be obtained by adding the PTAT voltage to the Vbe of about 600 mV, the value of the equation (12) must be multiplied by 5 and added to Vbe1. As a result, if the offset voltage VOFF exists, the effect of VOFF on Vbgr is multiplied by about (1+5)=6. (The BGR output equation illustrated in FIG. 11 indicates this effect of the offset voltage.)

That is, while the circuit of FIG. 10 has the advantage that the bandgap circuit can be achieved with relatively simple circuitry, it has the limitation that the accuracy of the reference voltage Vbgr that can be achieved is limited by the offset voltage of the operational amplifier.

The above description has been given by taking the circuit of FIG. 10 as an example to explain that the offset voltage of the operational amplifier used in the BGR circuit must be minimized in order to improve the accuracy of the output voltage of the bandgap circuit. As earlier described, a layout strategy called common centroid has been known in the prior art for minimizing the offset voltage.

Figure 12:
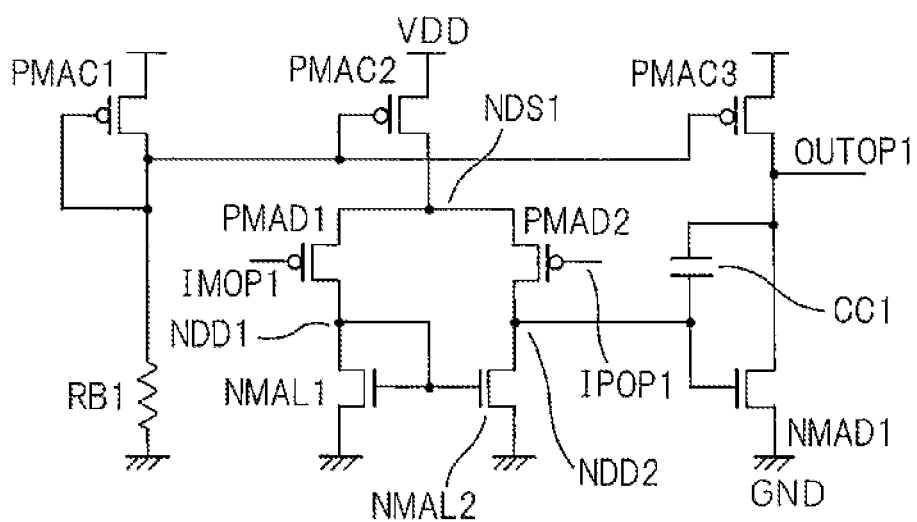
FIG. 12 is a diagram illustrating a circuit example of an operational amplifier contained in the bandgap circuit (BGR circuit)

FIG. 12 illustrates the operational amplifier at the transistor level.

In FIG. 12, PMAC1, PMAC2, and PMAC3 are PMOS transistors forming a current mirror, PMAD1 and PMAD2 are PMOS transistors forming a differential pair, RB1 is a bias resistor, NMAL1 and NMAL2 are NMOS transistors forming loads for the differential pair, NAMD1 is an NMOS transistor forming an amplifier stage whose source is grounded, CC1 is a phase compensation capacitor, IMOP1 is a negative input terminal of the operational amplifier, IPOP1 is a positive input terminal of the operational amplifier, NDD1 and NDD2 are drain nodes of the differential pair, NDS1 is a common source node of the differential pair, GND is a GND potential (0 V), and OUTOP1 is the output of the operational amplifier.

The circuit illustrated in FIG. 12 is a commonly used operational amplifier, and its operation will not be described in detail here.

It is known that the devices that need matching to minimize the input referred offset of the operational amplifier circuit of FIG. 12 are, first of all, the PMOS transistors PMAD1 and PMAD2. It is also required that the device characteristics of the NMOS transistors NMAL1 and NMAL2 be identical. A common centroid layout has been known as a layout scheme that achieves optimum arrangement of such transistors or devices that need matching.

Figure 2:
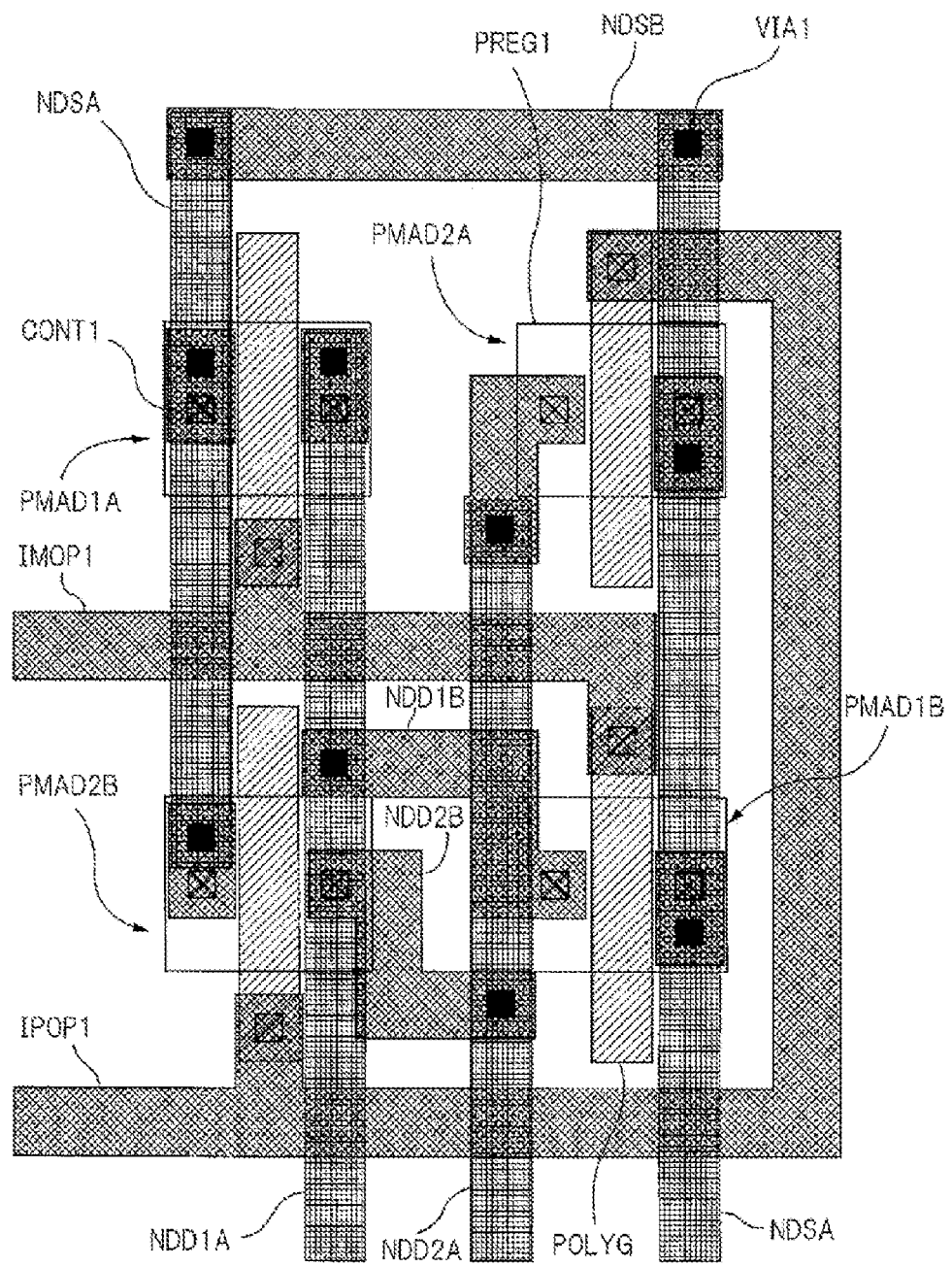
FIG. 2 is a diagram illustrating a layout example in which a transistor pair in an operational amplifier circuit is arranged in a common centroid configuration.

A layout example in which the PMOS transistors PMAD1 and PMAD2 in FIG. 12 are arranged in a common centroid configuration has been given in the previously illustrated FIG. 2. Since the common centroid layout has already been explained with reference to FIG. 2, the explanation will not be repeated here.

The foregoing description has illustrated that the output voltage of the bandgap circuit has a bearing on the output voltage accuracy of the regulator circuit, that the output voltage accuracy of the bandgap circuit is important, that the offset voltage of the operational amplifier must be reduced in order to maximize the accuracy of the bandgap voltage, and that the common centroid layout is known as a scheme for achieving that purpose.

It is known that the offset voltage of the operational amplifier and digital circuits are affected by the antenna effect. The antenna effect refers to a phenomenon in which, during a process (fabrication process) using a plasma for the fabrication of a MOS transistor, an electrical stress is applied to the gate oxide film of the MOS transistor because of the presence of electric charges in the plasma, leading to a reliability problem or causing the characteristics of the MOS transistor to change. When processing the metal interconnect line connected to the gate oxide film, the metal interconnect line being processed acts as an antenna and gathers electric charges, which can damage the gate oxide film; therefore, this phenomenon is generally called the antenna effect.

It has long been pointed out that, due to the electric charges gathered by the antenna (the metal interconnect line connected to the gate) during the processing of the metal interconnect line in the plasma process, the threshold voltage Vth of the MOS transistor changes, and unevenness in the antenna effect causes the offset voltage of the differential circuit to increase.

Figure 13A:
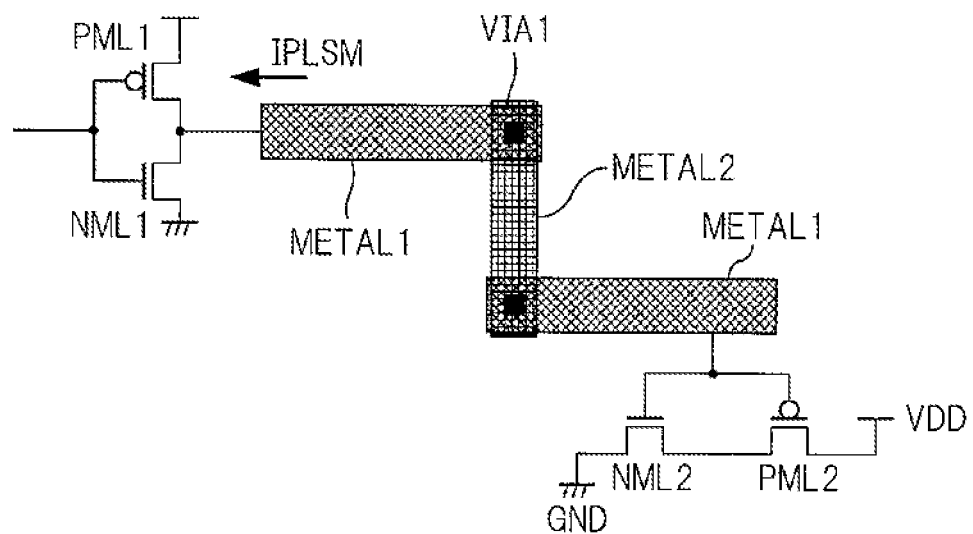
FIGS. 13A and 13B are diagrams explaining an antenna effect.
Figure 13B:
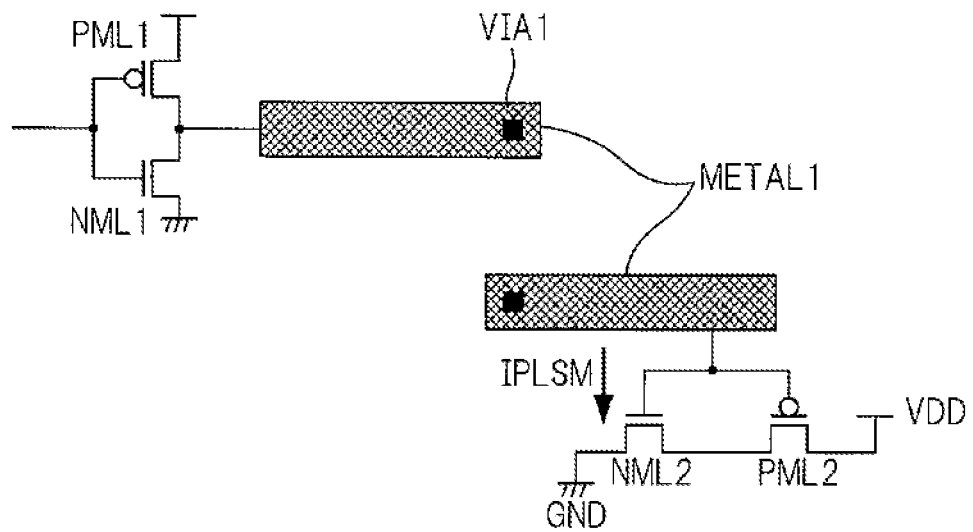

FIGS. 13A and 13B are diagrams explaining the antenna effect. In FIGS. 13A and 13B, PML1 and PML2 are PMOS transistors, NML1 and NML2 are NMOS transistors, VDD is a terminal which becomes a positive power supply terminal after the formation of the circuit, GND is a terminal which becomes a GND terminal after the formation of the circuit, METAL1 is a metal interconnect line on the first layer, METAL2 is a metal interconnect line on the second layer, VIA1 is a plated-through hole, and IPLSM is the current that flows in the plasma process.

The method of depicting the METAL1, METAL2, and VIA1 in FIGS. 13A and 13B is the same as that used in FIGS. 2 and 12, and the description thereof will not be repeated here.

FIG. 13A illustrates the current IPLSM that flows during the etching (patterning) of the METAL2. In the interconnection pattern such as illustrated in FIG. 13A, since the METAL2 is connected through the VIA1 to the METAL1 during the etching of the METAL2, the METAL2 is coupled to the drain junction between the PML1 and NML1. Accordingly, the electric charges gathered by the interconnect line during the etching of the METAL2 is discharged, for example, through a discharge path by the leakage current of the drain junction between the PML1 and NML1.

On the other hand, FIG. 13B illustrates the current that flows during the etching of the METAL1 which precedes the etching of the METAL2. According to the interconnect structure such as illustrated in FIG. 13B, the METAL1 connected to the drain of the PML1 and NML1 and the METAL1 connected to the drain of the PML2 and NML2 are formed as separate interconnect lines during the etching of the METAL1. As a result, the electric charged gathered by the METAL1 connected to the drain of the PML1 and NML1 are discharged through the same discharge path as that illustrated in FIG. 13A (that is, the drain of the PML1 and NML1). However, there is no discharge path for the electric charges gathered by the METAL1 connected to the gate of the PML2 and NML2 during the etching of the METAL1. There is therefore no alternative for the charges gathered during the plasma process but to flow into the gate oxide film, and the IPLSM flows as a tunneling current through the gate oxide film. This current causes the Vth of the MOS transistor to change or damages the gate oxide film.

To avoid such damage to the gate oxide film during the processing of interconnect lines, a protection diode called an antenna diode has traditionally been used.

Figure 14A:
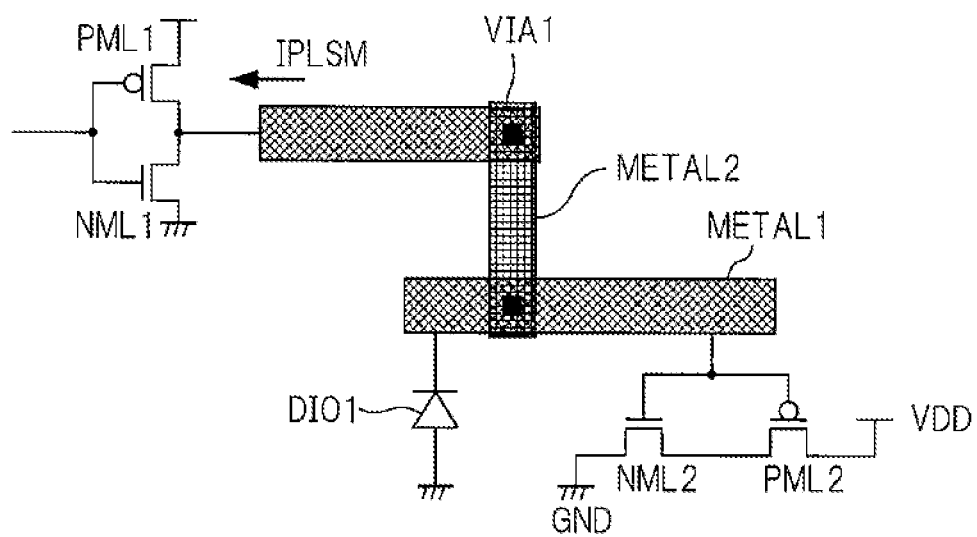
FIGS. 14A and 14B are diagrams illustrating an example of an antenna diode for preventing the antenna effect.
Figure 14B:
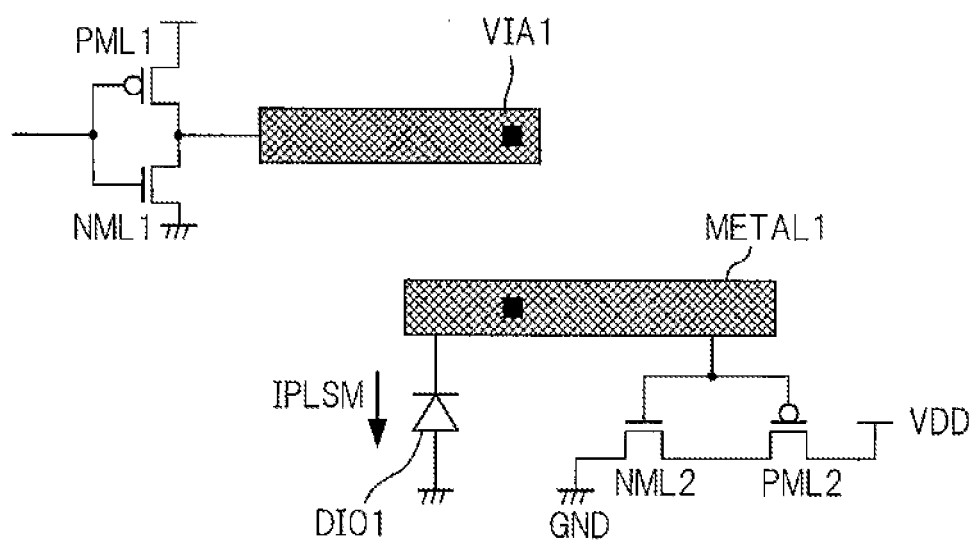

FIGS. 14A and 14B illustrate one example of the protection diode. FIGS. 14A and 14B differ from FIGS. 13A and 13B by the inclusion of the diode DIO1 and the modification of the METAL1 pattern for the connection of the diode DIO1, and the following description focuses on these differences.

FIG. 14A, as in FIG. 13A, illustrates the current that flows during the processing of the METAL2. In FIG. 13A, the current does not flow into the gate oxide film during the processing of the METAL2 because the metal being processed is coupled to the drain junction. In FIG. 14A also, since the interconnect structure is the same as that illustrated in FIG. 13A, the electric charges gathered by the interconnect line in the plasma process during the processing of the METAL2 do not cause damage to the gate oxide film. In FIG. 13B, because of the presence of the METAL1 connected only to the gate oxide film during the processing of the METAL1, the electric charges gathered during the processing of the METAL1 flows into the gate oxide film, which can cause damage to the gate oxide film. To avoid such a situation, in the structure of FIGS. 14A and 14B, the diode DIO1 called an antenna diode is connected to the METAL1 interconnect line connected to the gate. The provision of such a current path DIO1 serves to prevent the current from flowing into the gate oxide film during the processing of the METAL1 connected to the gate. The electric charges gathered by the METAL1 are discharged, for example, as the leakage current of the DIO1 through the IPLSM path illustrated in FIG. 14B. The DIO1 acts as a current discharge path during the processing of the interconnect lines, but during normal operation after the manufacture, this diode is reverse biased so that it has hardly any effect on the operation, though it induces a small amount of leakage current and an increase in capacitance and area.

Figure 1:
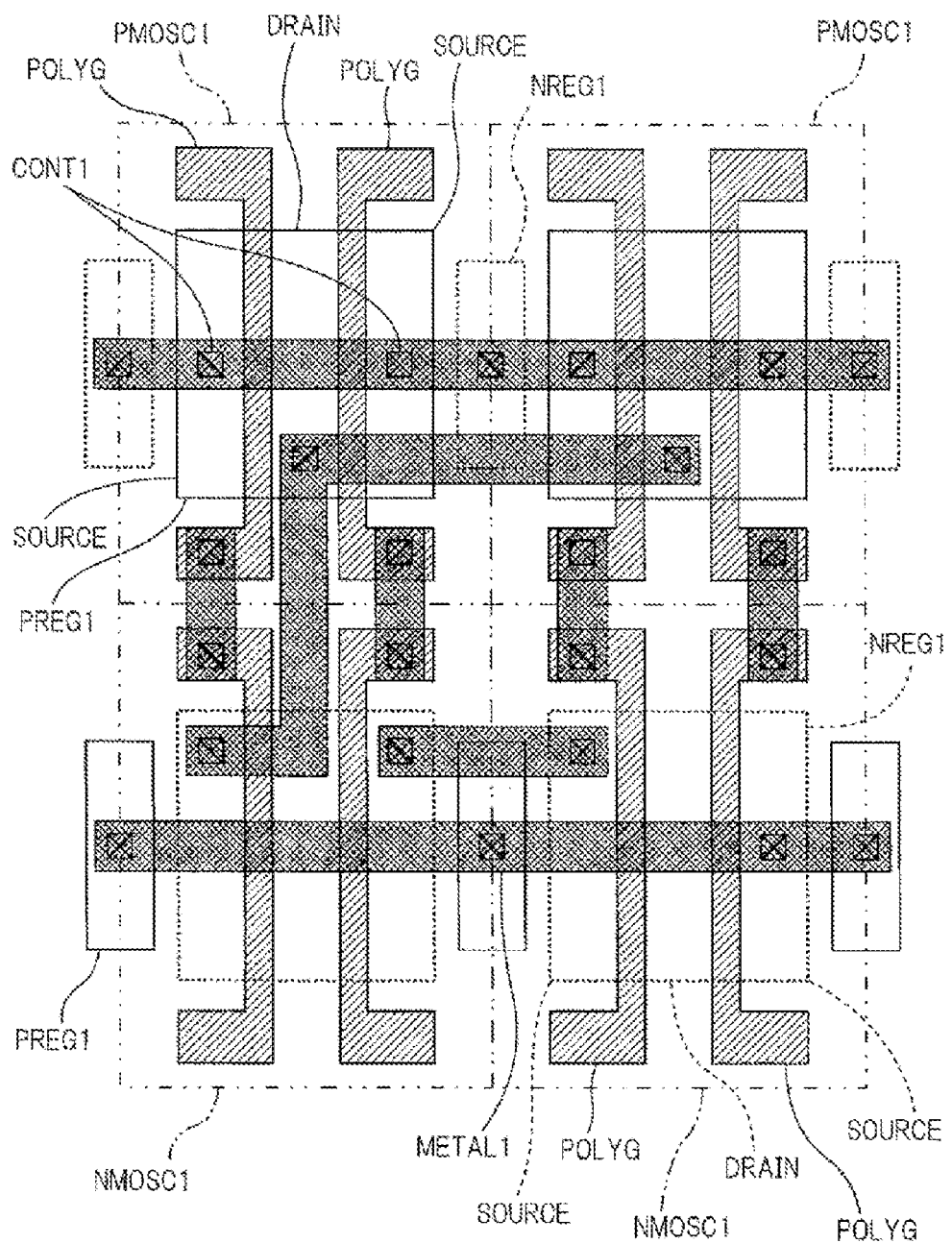
FIG. 1 is a diagram illustrating an example of the configuration and interconnect layout of a digital circuit gate array according to the prior art.
Figure 15:
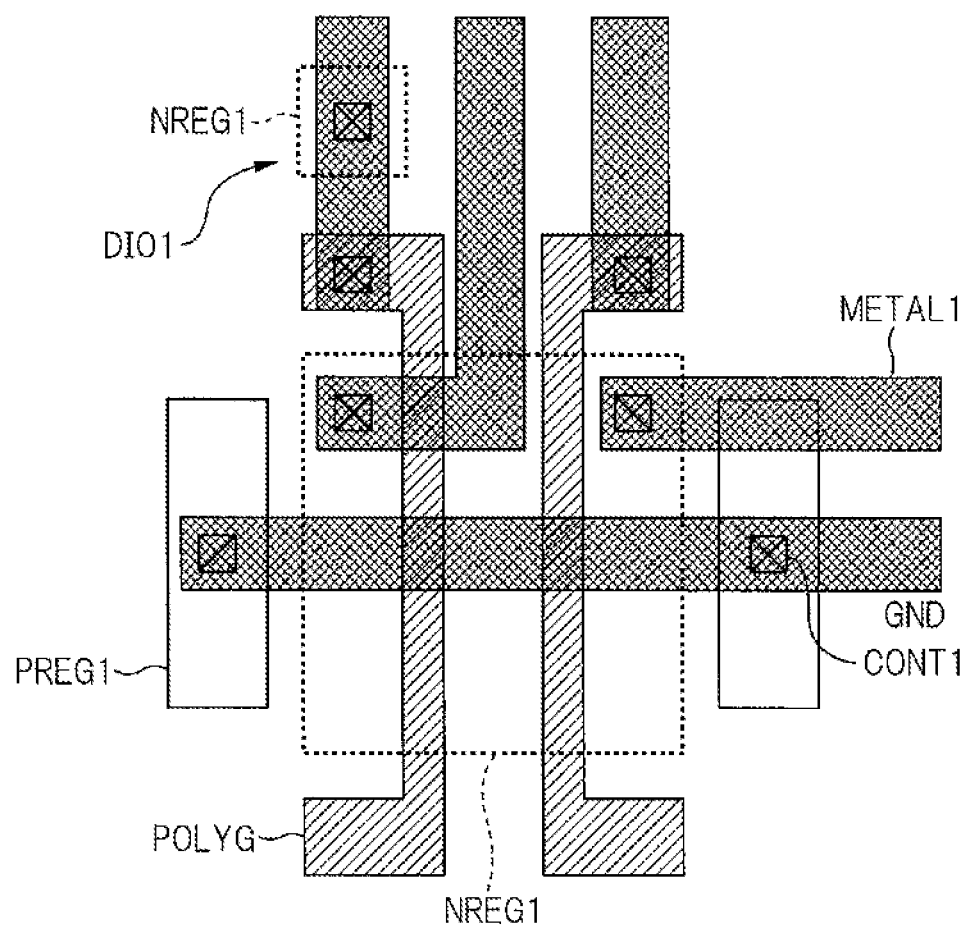
FIG. 15 is a diagram illustrating a prior art layout example of the antenna diode.
Figure 16:
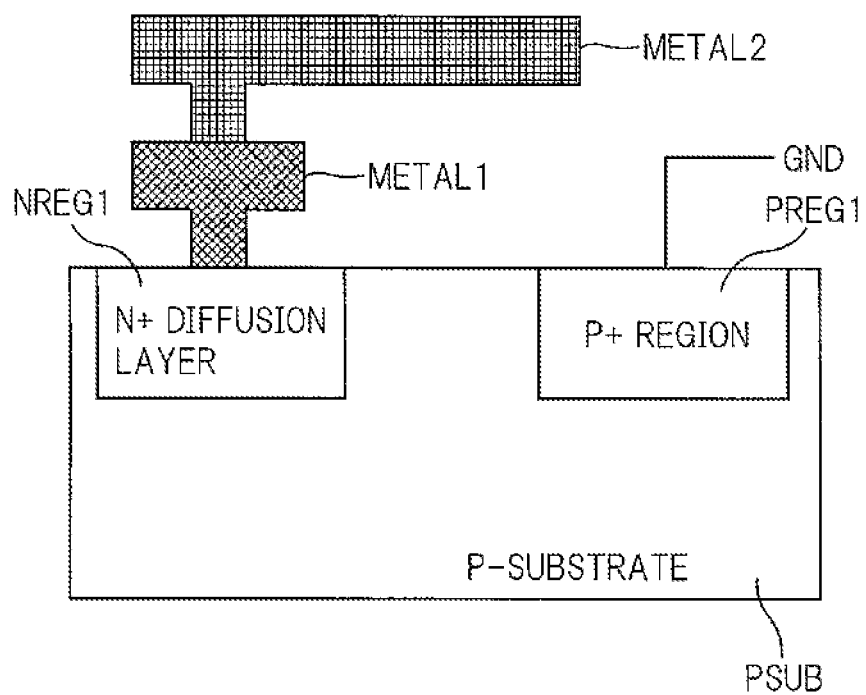
FIG. 16 is a diagram illustrating one example of a cross-sectional structure of the antenna diode.

FIG. 15 illustrates one example of the plane structure of the antenna diode, and FIG. 16 illustrates its cross-sectional structure. The method of depicting the POLYG, NREG1, PREG1, CONT1, METAL1, etc. in FIG. 15 are the same as that used in FIG. 1, and any description once given will not be repeated here. DIO1 in FIG. 15 indicates the portion that acts as the antenna diode. It is known that the gate oxide film can be protected by connecting a diode with a very small area to the METAL1 connected to the gate electrode, as illustrated in FIG. 15. For example, by connecting an N-type diffusion region NREG1 in the P-type substrate to the metal (METAL1), the reversed biased diode can be connected to the interconnect line connected to the gate electrode.

In FIG. 16, PSUB is the P-type substrate, PREG1 is the P-type diffusion layer (illustrated as the P+ region), NREG1 is the N-type diffusion layer (illustrated as the N+ region), GND is the portion that acts as the GND terminal, METAL1 is the interconnect line on the first layer, and METAL2 is the interconnect line on the second layer. As illustrated in FIG. 16, since the P-type substrate PSUB is held at GND potential during operation after the manufacture, the PSUB serves as the anode of the DIO1 and the NREG1 as the cathode. That is, as previously described, the diode is reverse biased so that it does not affect the circuit operation.

As explained with reference to FIGS. 14 to 16, it has been known that by using an antenna diode for the protection of the gate oxide film, it is possible to prevent the degradation or breakage of a microstructure transistor in a digital circuit or to prevent the increase of the offset voltage in the analog circuit section.

Figure 17:
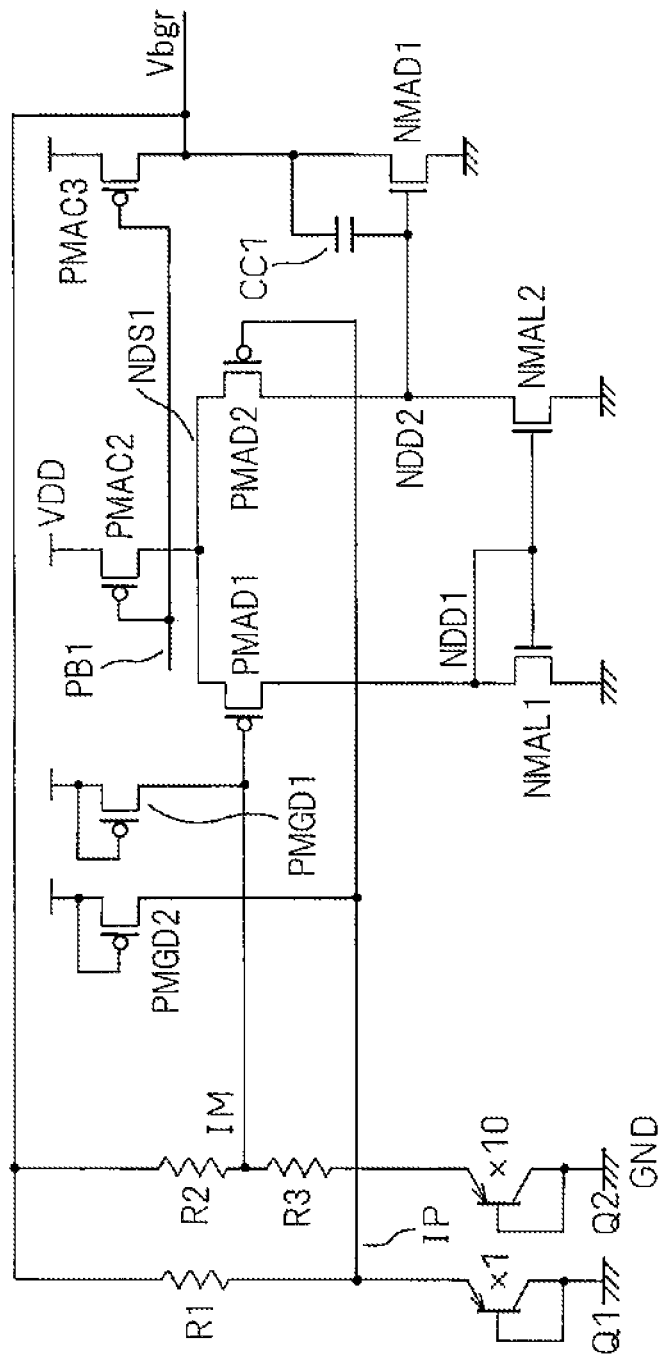
FIG. 17 is a diagram illustrating an operational amplifier and an antenna diode circuit implemented using the analog circuit cell array according to the embodiment.

Based on the techniques described above, a bandgap circuit such as illustrated in FIG. 17 is fabricated here.

In FIG. 17, PMAC2 and PMAC3 are PMOS transistors forming a current source, PMAD1 and PMAD2 are PMOS transistors forming a differential pair, R1, R2, and R3 are resistors, NMAL1 and NMAL2 are NMOS transistors forming loads for the differential pair, NAMD1 is an NMOS transistor forming an amplifier stage whose source is grounded, CC1 is a phase compensation capacitor, IM is a negative input to an operational amplifier, IP is a positive input to the operational amplifier, NDD1 and NDD2 are drain nodes of the differential pair, NDS1 is a common source node of the differential pair, VDD is, for example, a 5-V power supply, GND is a GND potential (0 V), Vbgr is the output of the bandgap circuit, Q1 and Q2 are pnp bipolar transistors (hereinafter abbreviated pnp BJTs), the number affixed to each BJT indicates the relative area ratio of the BJT, PMGD1 and PMGD2 are transistors acting as antenna diodes, and PB1 is a bias voltage. (The device name beginning with R indicates a resistor, the device name beginning with PM indicates a PMOS transistor, the device name beginning with NM indicates an NMOS transistor, and the device name beginning with C indicates a capacitor.)

In FIG. 17, the devices and nodes corresponding to those in FIGS. 10 and 12 are indicated by the same designations so that their correspondences can be easily identified.

As previously explained with reference to FIG. 12, the devices that need matching to minimize the input referred offset of the operational amplifier circuit are, first of all, the PMOS transistors PMAD1 and PMAD2. It is also required that the device characteristics of the NMOS transistors NMAL1 and NMAL2 be identical.

Figure 18:
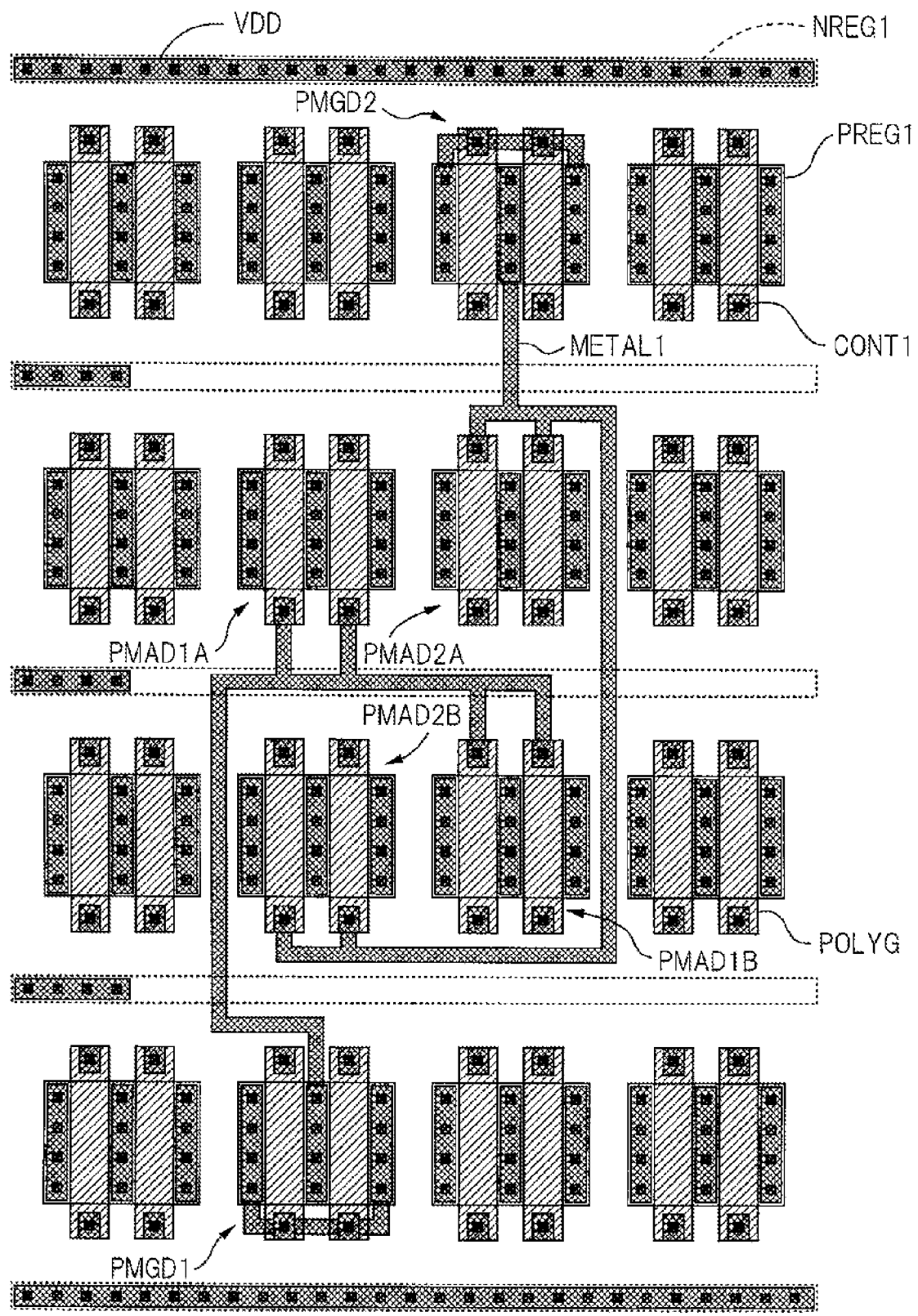
FIG. 18 is a diagram illustrating an example of layout at a first metal interconnect level in which a P-type transistor pair in the operational amplifier of FIG. 17, arranged in a common centroid configuration, and antenna diodes are implemented using the analog circuit cell array according to the embodiment.

FIG. 18 is a diagram illustrating a layout example in which the two PMOS transistors PMAD1 and PMAD2 forming the PMOS transistor pair in the bandgap circuit of FIG. 17 and the two PMOS transistors PMGD1 and PMGD2 acting as the antenna diodes are formed using an analog circuit cell array. The layout example of FIG. 18 illustrates the interconnection pattern at the METAL1 layer level.

In FIG. 18, CONT1 is a contact, PREG1 is a P-type diffusion region, METAL1 is an interconnect line on the first layer, POLYG is a Poly-Si gate electrode (polysilicon gate electrode), NREG1 is an N-type diffusion region, VDD is a region that acts as a positive power supply, PMAD1A and PMAD1B are transistors arranged by splitting the PMAD1 illustrated in FIG. 17, PMAD2A and PMAD2B are transistors arranged by splitting the PMAD2 illustrated in FIG. 17, and PMGD1 and PMGD2 are PMOS transistors acting as the antenna diodes.

PMAD1A and PMAD1B in FIG. 18 are transistors arranged by splitting the PMAD1 illustrated in FIG. 17, and PMAD2A and PMAD2B are transistors arranged by splitting the PMAD2 illustrated in FIG. 17. The PMAD1A and PMAD1B and the PMAD2A and PMAD2B, respectively, are arranged diagonally opposite each other to achieve a common centroid configuration.

Suppose, for example, that the oxide film thickness is formed unevenly at the time of manufacture. The PMAD1 comprises a parallel connection of the PMAD1A formed at the left and PMAD1B formed at the right. On the other hand, the PMAD2 comprises a parallel connection of the PMAD2B formed at the left and PMAD2A formed at the right; as a result, between the PMAD1 and PMAD1, the difference in the device characteristics between the left and the right is canceled out. It is also obvious that the difference in the device characteristics between the top and the bottom are canceled out in like manner.

As earlier described, in the fabrication process of MOS transistors with ever decreasing feature sizes, a step may be employed that implants ions from an oblique direction. In this case, the width of the area where the high concentration region of the source/drain diffusion layer overlaps the gate electrode can become different, for example, between the right and left sides of the Poly-Si gate electrode POLYG. This causes a situation where the effective parasitic resistance differs between the right and left sides of the POLYG, and as a result, a situation occurs where the characteristics of the MOS transistor become different when the source is formed in the diffusion layer on the right side of the POLYG and the drain in the diffusion layer on the left side than when the source is formed in the diffusion layer on the left side of the POLYG and the drain in the diffusion layer on the right side. Because of such characteristics of the fabrication process, the device geometry and the method of using the device, including the direction in which the current flows, must be made to match between the transistors that need matching.

However, the direction of current at the time of layout cannot be checked by software called LVS or DRC that is used to check circuit interconnections. The reason is that, in order to check the direction in which the current flows in the MOS transistor, a full understanding of the complex circuit becomes necessary which involves understanding the circuit operation and recognizing the devices that need matching. As a result, it has been the prior practice to manually check the sameness of the device arrangement, including the direction of current. To solve this problem, in the layout of FIG. 18, two MOS transistors having a common drain, as illustrated in FIG. 18, are used as the basic layout unit.

In FIG. 18, two PMOS transistors having a common drain and having the same gate width and gate length are employed as the basic unit of the layout. With the DRAIN1 in the center as the drain and the left and right electrodes as the sources, a parallel connection of two transistors whose directions of current are opposite to each other is realized within each basic cell unit. This offers the effect that when arranging the PMAD1 and PMAD2 in a common centroid configuration, as illustrated in FIG. 18, there is no need to consider the direction of current of each individual transistor. The reason is that the PMAD1A, PMAD1B, PMAD2A, and PMAD2B are each formed from a parallel connection of a transistor in which the current flows in the rightward direction and a transistor in which the current flows in the leftward direction and, as a result, the differences in device characteristics due to the difference in current flow direction are canceled out.

When the basic unit is configured as a parallel connection of two transistors whose directions of current are opposite to each other, the advantage of being able to eliminate the need to consider or examine the direction of current in detail can be obtained, as long as the basic cell structure illustrated in FIG. 18 is observed. That is, the possibility of overlooking the differences in characteristics due to the difference in current direction can be reduced to zero.

In FIG. 18, the peripheral area of the array of basic PMOS transistor cells PMOSC2 arranged in four rows and four columns functions similarly to the prior art dummy device. That is, the center area where the transistors are orderly arranged in a repeated fashion is less affected by the peripheral area, and it is expected that processing uniformity improves in this area; therefore, the devices that need matching are placed in the center area.

For this reason, in FIG. 18 also, the PMAD1A, PMAD2A, PMAD1B, and PMAD2B are arranged in the center of the array.

If, for example, the antenna diode for protecting the gate oxide film is provided as a dedicated antenna diode outside the transistor array, there arises the problem that it is difficult to connect the diode with the METAL1 interconnect line. On the other hand, if the diode of different geometry is added to the array of the orderly arranged transistors, the symmetry and sameness of the transistor geometry and isolation region geometry cannot be maintained. Furthermore, if the diode is placed, for example, within the PMOS basic cell, the problem of the sameness within the layout unit can be solved, but a large number of diodes that are not actually used have to be provided, which is disadvantageous from the viewpoint of efficient utilization of chip real estate.

In view of the above, in the layout of the present embodiment, the drain electrode of a basic cell transistor, for example, is used as an antenna diode. (Instead, the source electrode may be used.)

As illustrated in the circuit diagram of FIG. 17, for example, to protect the gates of the PMOS transistors that need matching, the drain electrodes of the PMOS transistors whose gates are held at the VDD potential are connected to the gates of the PMAD1 and PMAD2 by using METAL1 interconnect lines. When the gates and sources of the PMGD1 and PMGD2 are held at VDD, the PMGD1 and PMGD2 are held in the OFF state and do not function as transistors. By using the drain junctions of the PMGD1 and PMGD2 as the diodes, the gate oxide films can be protected by the antenna diodes without disrupting the orderliness and sameness of the transistor array. As illustrated in FIG. 18, interconnect channels are provided on the PMOS basic cells and along the left and right sides of each PMOS basic cell so that the METAL1 interconnect lines can be added. By employing such a basic cell structure, the gates of the PMOS basic cells arranged in a common centroid configuration can be connected together by the METAL1 interconnect lines for connection to the drains of the respective transistors acting as the antenna diodes.

In this way, the transistors that need matching are placed in the center area of the PMOS array, and the antenna diodes are formed using edge portions of the array. The characteristics of the antenna diodes need not be identical. In the example illustrated in FIG. 18, the PMGD2 is placed in the top row of the array, and the PMGD1 in the bottom row of the array. Since the PMAD1 and PMAD2 are placed in the second and third rows, interconnect lines for connecting the antenna diodes to the gates to be protected need to be formed along the longitudinal direction using METAL1. That is, it is required that the transistor array be configured to provide a structure that allows the use of the longitudinal METAL1 interconnect lines. FIG. 18 illustrates one example of the structure that satisfies this requirement.

Since an N region NREG1 for feeding an N-type well in PMOS is included in the basic cell structure to maintain the uniformity and periodicity of the device isolation region, a well-feeding region exists between each row of basic cells. There is no need to supply the VDD potential to all the NREG1 regions by using METAL1 but, in principle, it is desirable that the NREG1 regions be supplied with VDD by using METAL1 (connected via the contacts CONT1s). Further, since the gate POLYG region needs connecting portions (GATE1, GATE2, GATE3, and GATE4 in FIG. 5) for connecting to the POLYG-connecting METAL1, to construct the circuit a region where an interconnect line can be formed in the lateral direction must be secured somewhere other than directly above the NREG1.

In view of this, a region where a METAL1 interconnect line can be formed in the lateral direction is secured between the NREG1 and the gate contact region in FIG. 18. The reason that METAL1 is used for the interconnect line in this region is that it is preferable to use METAL2 for longitudinal interconnect lines.

Figure 19:
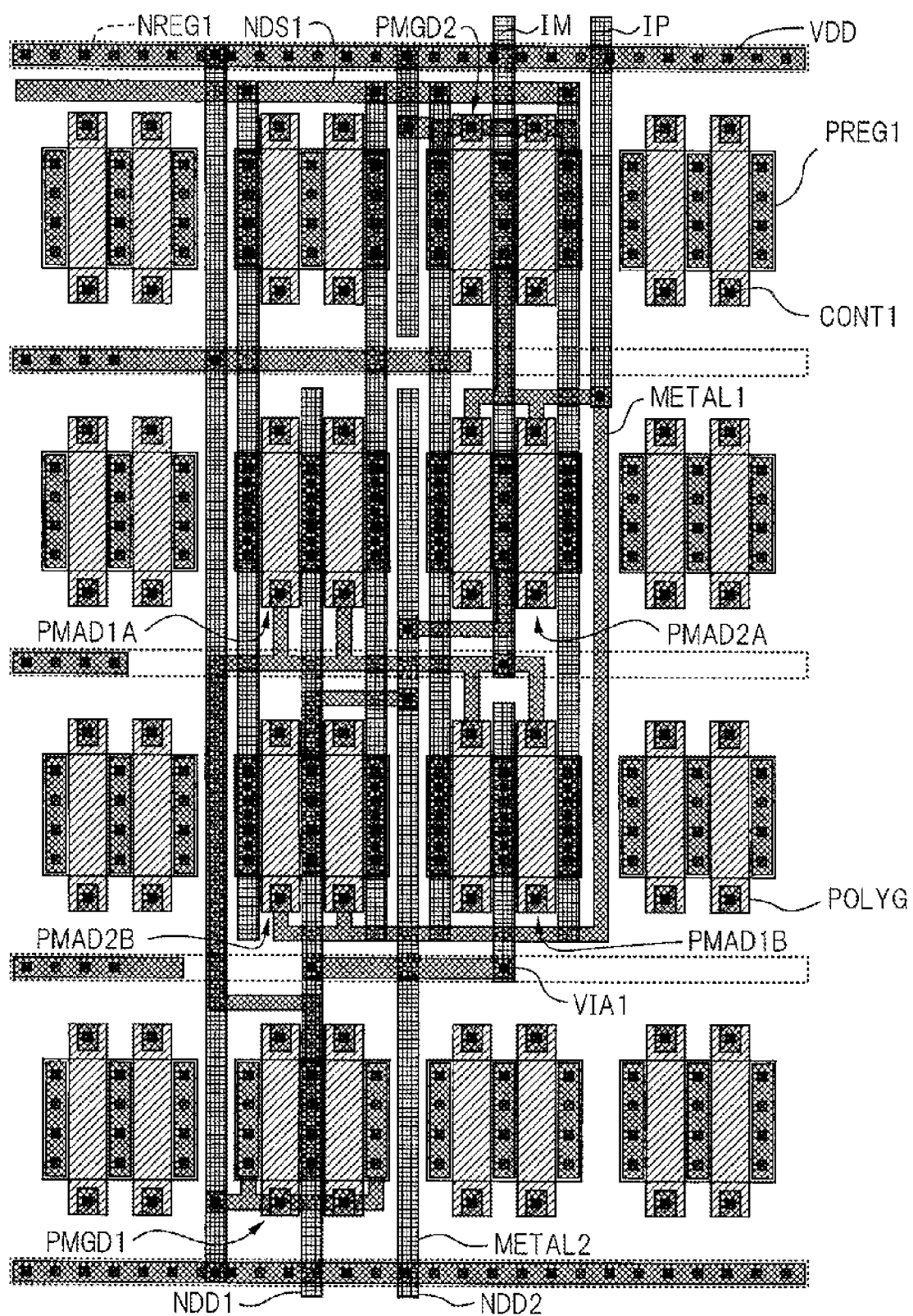
FIG. 19 is a diagram illustrating an example of layout up to a second metal interconnect level in which the P-type transistor pair in the operational amplifier of FIG. 17, arranged in a common centroid configuration, and the antenna diodes are implemented using the analog circuit cell array according to the embodiment.

FIG. 19 is a diagram illustrating the layout of FIG. 18 with METAL2s and VIA1s added to it (some METAL1s are also added). The diagram explains how the nodes can be connected or brought outside in the structure of FIG. 18. Examples of the connections will be described by also referring to FIG. 18 for portions where the layers overlap each other and appear confusing.

The explanation of the layout, including the METAL2 interconnect lines, will be continued with reference to FIG. 19. In FIG. 19, METAL2 is a metal interconnect line on the second layer, VIA1 is a plated-through hole, and IM, IP, VDD, NDS1, NDD1, and NDD2 are the portions corresponding to the circuit nodes having the same designations in FIG. 18. In FIG. 19, PVIA1 is illustrated by a filled square, and METAL1 by cross hatching with oblique lines inclined at 45 degrees. METAL2 is indicated by hatching with horizontal and vertical lines crossing at right angles. The method of depicting the other layers is the same as that used in the previously illustrated figures.

From FIG. 18, it can be seen that the drain of the PMGD2 can be connected to the gates of the PMAD2A and PMAD2B by the METAL1. Likewise, it can be seen that the gates of the PMAD1A and PMAD1B can be connected to the drain of the PMGD1 by the METAL1. FIG. 19 illustrates an example of how the connections are made to the sources and drains of the PMAD1 and PMAD1 and the gates and sources of the PMGD1 and PMGD2.

The source electrodes of the PMAD1A, PMAD2A, PMAD2B, and PMAD1B must be connected to the common source node NDS1. To achieve these connections, the sources of the PMOS transistors of the differential pair are connected via the VIA1s to the common node by using the METAL2 interconnect lines extending longitudinally above the source electrodes. Since the source and drain of each transistor are invariably provided with the contacts CONT1s and the METAL1s (as illustrated in FIG. 18) for connecting the diffusion layers to the interconnect lines, the interconnect layer passing above these regions in the longitudinal direction is naturally the METAL2 layer. As a result, the interconnect lines connecting between the two METAL2 interconnect lines connecting the sources of the PMAD1A and PMAD2B and between the two METAL2 interconnect lines connecting the sources of the PMAD2A and PMAD1B are METAL1 interconnect lines or METAL3 interconnect lines on the third layer.

In the example illustrated in FIG. 19, the METAL2 interconnect lines brought out from these source electrodes are connected via the VIA1s to the laterally extending METAL1 interconnect line designated by NDS1.

As described with reference to FIG. 18, it is preferable to use METAL1 interconnect lines as lateral interconnect lines and METAL2 interconnect lines as longitudinal interconnect lines; the reason is that a greater number of longitudinal interconnect lines can be secured when METAL2 interconnect lines are used as longitudinal interconnect lines as illustrated in FIG. 19 than would be the case if METAL1 interconnect lines were used as longitudinal interconnect lines. Since METAL1 interconnect lines are already formed in the source and drain regions, if METAL1 were to be used for the longitudinal interconnect lines, only the region between the transistor and its adjacent transistor could be used for the interconnect lines. In contrast, when METAL2 interconnect lines are used as the longitudinal interconnect lines, the advantage is that that the regions above the drain and source can be used as the longitudinal interconnect channels.

As already explained, the threshold voltage Vth of the MOS transistor may change when an interconnect line is present above the current channel of the transistor than when it is not. To avoid this, interconnect lines cannot be formed above the regions where the POLYGs overlap the PREG1 in FIG. 19, i.e., above the channel regions in each of which an inversion layer in the transistor is formed. In FIG. 19 also, no interconnect line whatsoever is provided above the current channel of the transistor. This also explains why it is advantageous to form the METAL2 interconnect lines in the longitudinal direction and use the regions above the drain and sources as the interconnect channels.

The METAL1 interconnect line in the uppermost portion of the array is illustrated as being VDD. Since this portion is the portion for feeding the N-type well region, the METAL1 in this portion is connected to VDD. Further, the well-feeding region between each row of the array, where a METAL1 interconnect line can be formed, is also VDD. By connecting these METAL1 interconnect lines by the METAL2 in the longitudinal direction, VDD can be supplied to the various parts. This also achieves a mesh-like power supply configuration, which is advantageous.

In FIG. 18, the gate and source of the PMGD2 are illustrated as not being connected to the VDD, but they can be connected to the VDD interconnect line at the peripheral edge of the array by using the longitudinally extending METAL2 and laterally extending METAL1 interconnect lines as illustrated in FIG. 19. For the PMGD1 also, as can be seen from FIG. 19, VDD can be fed to the gate and source in the same manner as the PMGD2.

The NDD1 must be connected to the drains of the PMAD1A and PMAD1B. In FIG. 19, the NDD1 is illustrated as being a METAL2 interconnect line. It can be connected by using the VIA1s and the laterally extending METAL1 and longitudinally extending METAL2 interconnect lines. Though not illustrated in FIG. 18 to simplify the illustration, in FIG. 19 the drain electrode of the PMAD2B is connected to the NND2 of METAL2 by using a METAL1 interconnect line. By providing a gap capable of passing a METAL1 interconnect line between the gate/METAL1 connecting portions of the basic cell, the connection such as illustrated in FIG. 19 becomes possible.

Since the transistor gate length L is as large as 1 μm to 2 μm in the case of an analog circuit, it is sufficiently possible to pass a METAL1 interconnect line through the gap between the METAL1s of the GATE1 and GATE3 or the gap between the METAL1s of the GATE2 and GATE4 of the PMOS basic cell illustrated in FIG. 5.

Since the METAL2 interconnect line for connecting the drain of the PMAD1A passes above the drain of the PMAD2B, the drain of the PMAD2B is brought out using METAL1. Likewise, the drain electrode of the PMAD2A is brought out using the METAL1 interconnect line passing between the metals of the gate contact portions. This is because the METAL2 interconnect line IM for bringing out the gates of the PMAD1A and PMAD1B is passed above the drain electrode of the PMAD2A.

The METAL2 interconnect lines IM and IP extend in the longitudinal direction and are connected to the gates of the PMAD1 and PMAD2, respectively. Since the gates of the PMAD1 and PMAD2 are protected by the drains of the PMGD1 and PMGD2 acting as the antenna diodes, the gates can be brought out by connecting the METAL1 interconnect lines to the METAL2 interconnect lines.

While FIG. 19 has only illustrated the differential pair, PMAD1 and PMAD2, and their connections to the antenna diodes, it will be appreciated that any desired circuit can be constructed using the constitution of FIG. 19. That is, the common centroid layout can be achieved using the constitution of the basic cell structure and interconnect channels such as those illustrated in FIGS. 18 and 19. It will also be appreciated that while the transistors not used are illustrated as being left unconnected, these transistors may also be used as circuit elements, that while the array has been illustrated as including four columns for convenience of illustration, the number of columns may be suitably chosen, that while the number of rows has also been illustrated as being four, this number is the minimum number of rows required to allow the use of the center area of the array, and a larger number of rows may be used, and that when leaving the transistors in the peripheral area unused, their gates, drains, sources, etc. can be easily fixed to the power supply potential. The contacts and METAL1 interconnect lines for the well-feeding regions are not fully illustrated, but the VDD potential can be supplied as desired by forming interconnect lines where necessary.

The above has described the example of implementing the PMOS transistors PMAD1 and PMAD2 of the operational amplifier in the bandgap circuit of FIG. 17 by using the PMOS array ARYP1. The NMOS transistors NMAL1 and NMAL2 of the operational amplifier can be implemented in like manner by using the NMOS array ARYN1.

Figure 20:
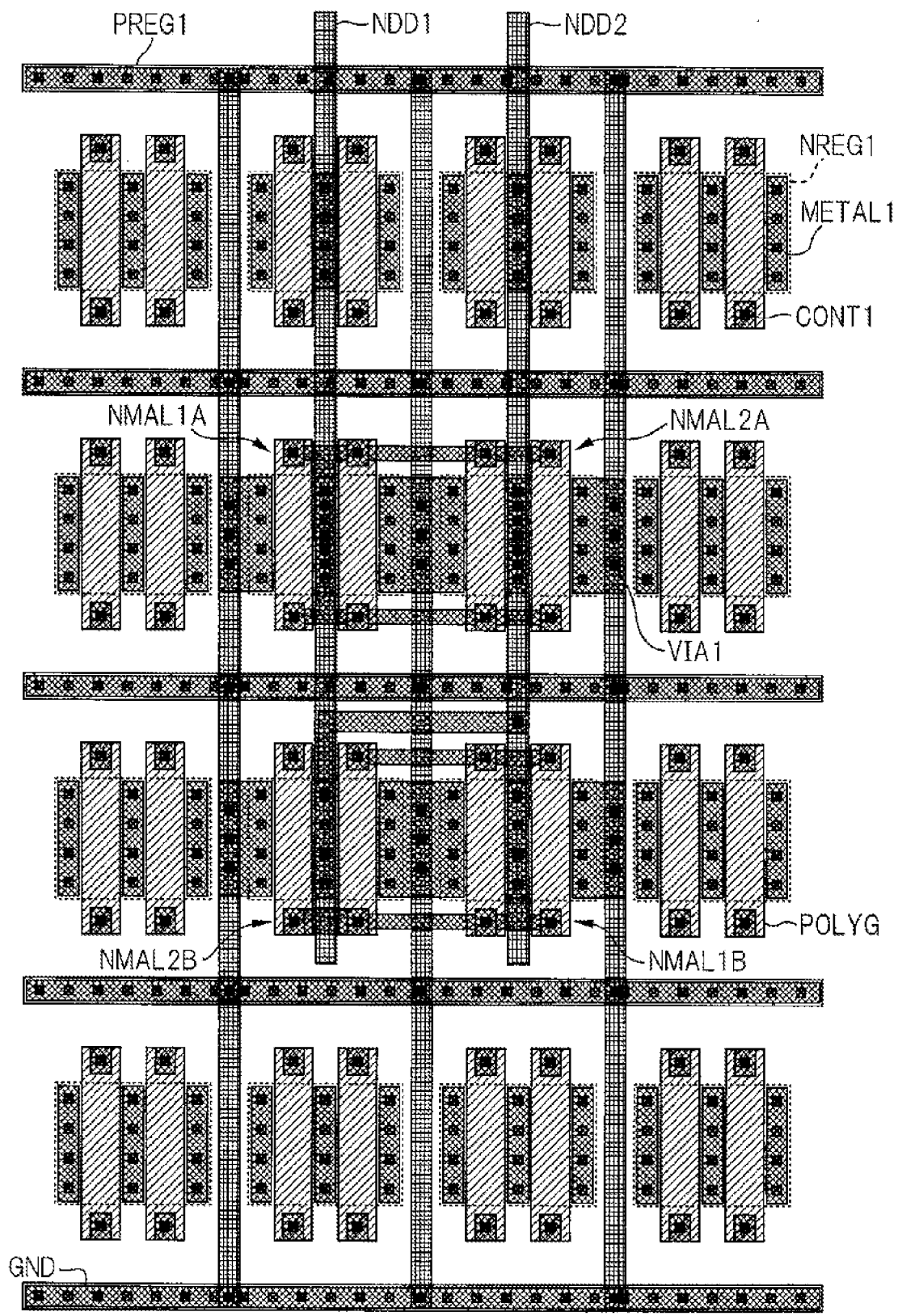
FIG. 20 is a diagram illustrating an example of layout up to the second metal interconnect level in which an N-type transistor pair in the operational amplifier of FIG. 17, arranged in a common centroid configuration, are implemented using the analog circuit cell array according to the embodiment.
Figure 21:
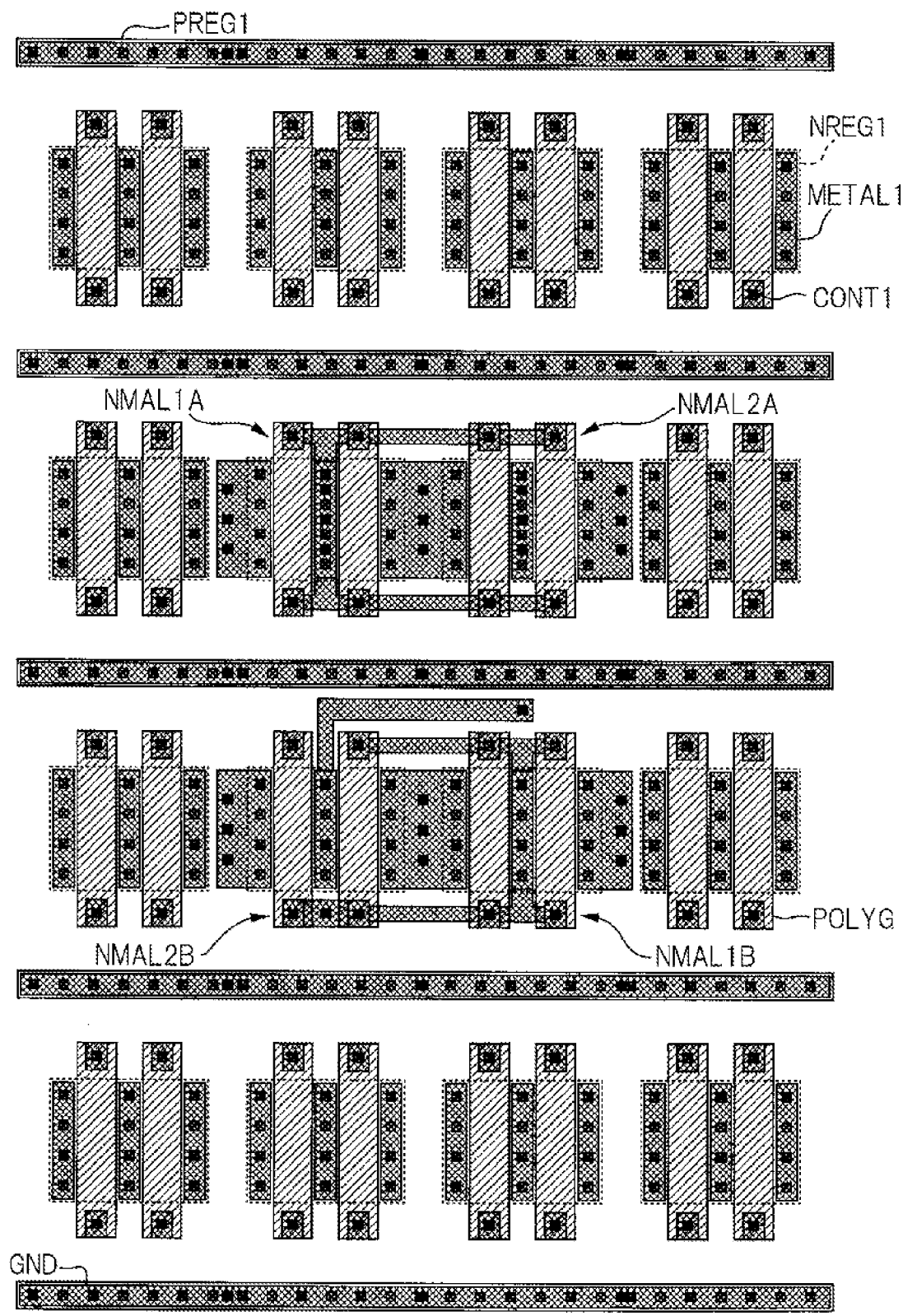
FIG. 21 is a diagram illustrating an example of layout at the first metal interconnect level in which the N-type transistor pair in the operational amplifier of FIG. 17, arranged in a common centroid configuration, are implemented using the analog circuit cell array according to the embodiment.

FIG. 20 illustrates an NMOS array layout/connection example for the NMOS array ARYN1 up to the METAL2 interconnect level. FIG. 21 illustrates the layout at the METAL1 level by removing the METAL2 regions. Referring to these figures, an explanation will be given of how the NMOS circuit section can also be constructed using the constitution of the invention so far described by taking PMOS as an example.

If the offset voltage of the operational amplifier in the bandgap circuit of FIG. 17 is to be minimized, it is required that the characteristics of the NMAL1 and NMAL2 be identical. It is also desirable that the characteristics of the NMAD1 be identical with those of the NMAL1 and NMAL2, but since this makes the illustration complicated, the following describes a common centroid layout example of the NMAL1 and NMAL2 with reference to FIGS. 20 and 21.

The method of depicting the layout layers in FIGS. 20 and 21 is the same as that used in the previously illustrated figures. The layout for the NMOS transistors illustrated here is essentially the same as that for the PMOS array, except that the source and drain regions are formed from NREG1 and that the well-feeding regions formed from NREG1 in the PMOS array are replaced by P-substrate feeding regions PREG1s.

In FIG. 20, NDD1 and NDD2 are interconnect lines corresponding to the circuit nodes NDD1 and NDD2 of FIG. 17. The NMAL1 and NMAL2 are split, the former into NMAL1A and NMAL1B and the latter into NMAL2A and NMAL2B, and are arranged in a common centroid configuration. Since the gate and drain of the NMAL1 are the same node, the METAL1 at the contact potion of the gate region and the METAL1 in the drain region are connected together, as illustrated in FIG. 21.

As illustrated in FIG. 20, the METAL2 interconnect line NDD1, for example, can be connected to the drain of the NMAL1A through VIA1 and to the METAL1 in the gate region of the NMAL2B through VIA1, thereby accomplishing the connections to the NDD1. Likewise, the NDD2 can be connected to the NMAL2A by connecting the longitudinal METAL2 interconnect line to the drain through VIA1. In the case of FIG. 20, the METAL2 interconnect line of the NDD1, for example, passes above the drain of the NMAL2B; therefore, the drain should be brought out using a METAL1 interconnect line and connected to the NDD2. The GND interconnect line should be connected to the source electrodes by using the METAL1 interconnect line for feeding the PREG1, and then using longitudinal METAL2 interconnect lines.

As illustrated in FIGS. 20 and 21, in this case, since the NMOS source potential is GND, the interconnections are simpler than those for the PMOS differential circuit section. In the PMOS differential circuit section, interconnections become necessary for the NDS1 since the source potential is not VDD, but in the case of the NMAL1 and NMAL2, the source of each NMOS transistor need only be held at the same potential as the P-substrate feeding region, which serves to reduce the total number of interconnect lines required. That is, if the layout can be accomplished for the circuit section in which the source potential is not the power supply potential, as illustrated in FIG. 18, then any desired circuit sufficient for practical use can be connected and implemented using the constitution of the present invention.

Figure 22:
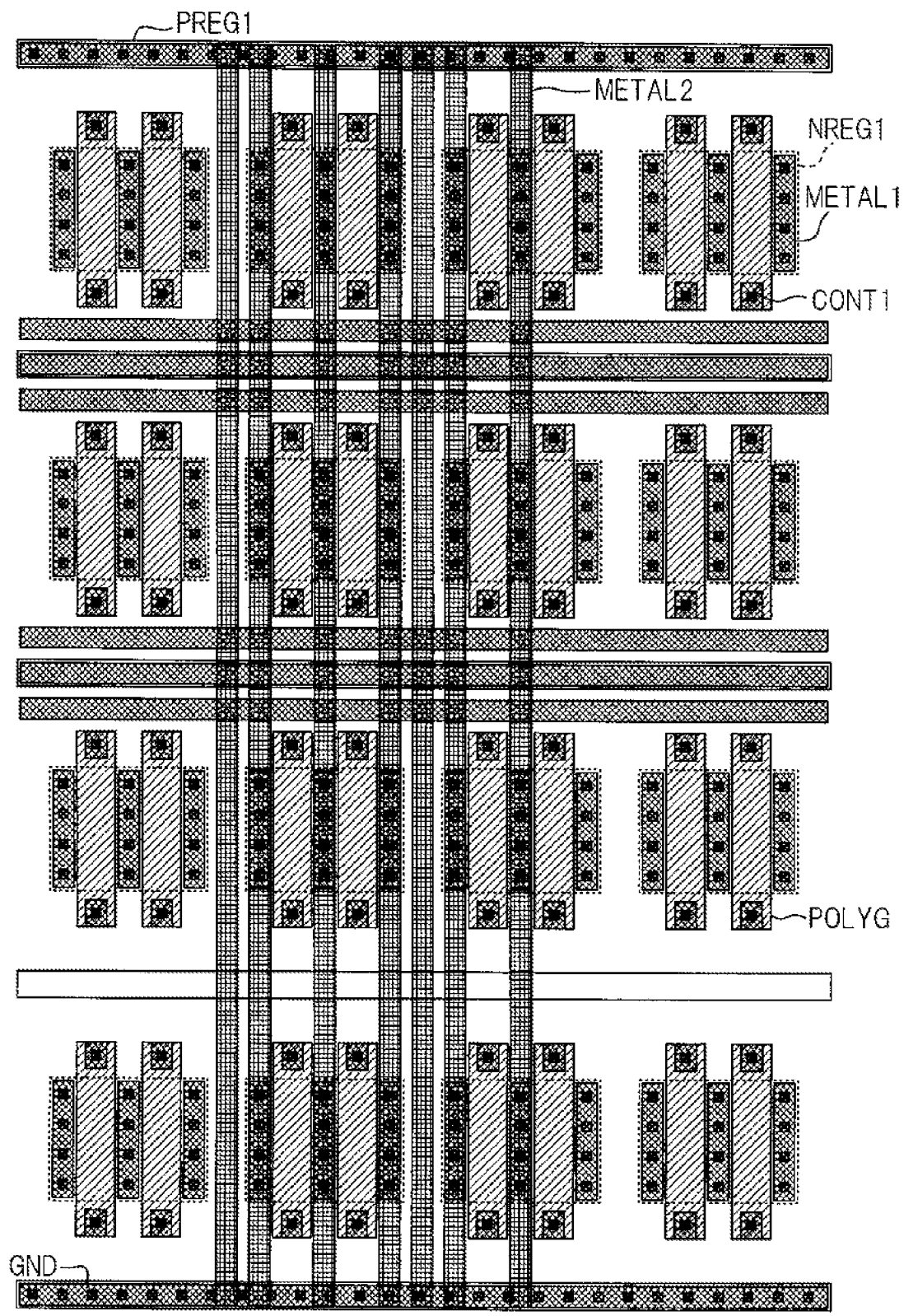
FIG. 22 is a diagram explaining interconnect channels in the analog circuit cell array according to the embodiment.

FIG. 22 is a diagram illustrating the interconnections when interconnect lines are arranged in a virtual fashion in the regions where the interconnections can be made to the NMOS transistors, as in the case of FIG. 8. It can be seen that the interconnections can be made to the NMOS transistors in the same manner as the PMOS transistors, except that the polarity of the diffusion layer is inverted, and that in the case of the NMOS transistors also, the interconnect channels can be arranged by avoiding the regions above the current channels.

Next, an alternative example of the basic cell repeating structure will be described with reference to FIGS. 23 to 28.

Figure 23:
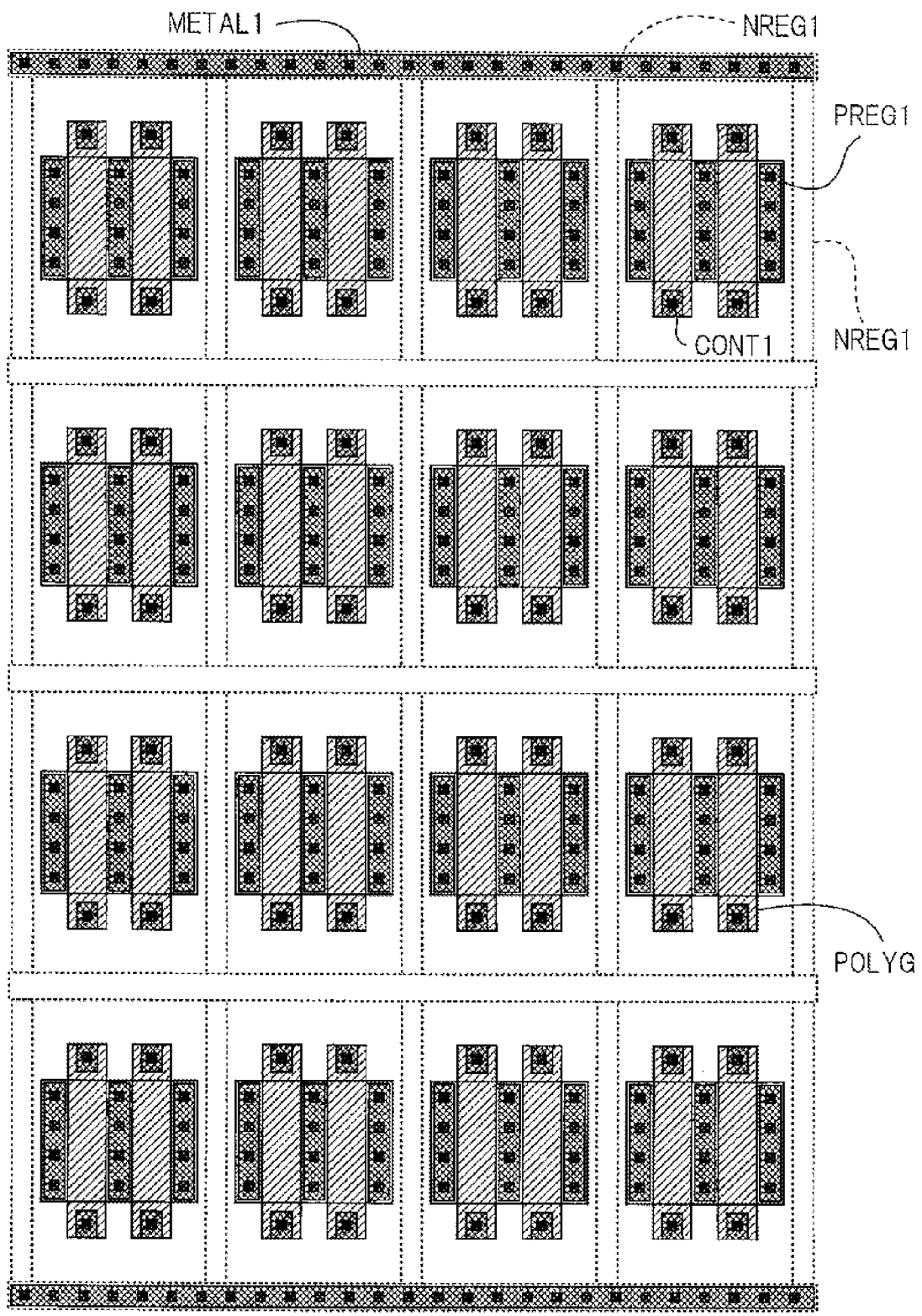
FIG. 23 is a diagram illustrating a modified example of the PMOS basic cell structure of the analog circuit cell array according to the embodiment.

FIG. 23 illustrates the alternative example of the basic structure of the PMOS array. The method of depicting the layers is the same as that used in FIG. 5. FIG. 5 has illustrated the structure in which the NREG1s for feeding the N-type wells are provided on the upper and lower sides of the basic cells. In FIG. 23, on the other hand, the structure is such that the well-feeding regions are provided on the left and right sides of the cells as well as the upper and lower sides of the cells. As explained with reference to FIG. 5, there is a need to implement the repeating structure, including the well-feeding regions. By incorporating the NREG1s for feeding the potential to the wells into the basic cell structure at the left and right edges of the array, the effects of the array edge regions can be reduced even when the number of columns is small.

The structure in which the well-feeding regions are also provided on the left and right sides of the cells can be applied to the NMOS basic cell repeating structure.

Figure 24:
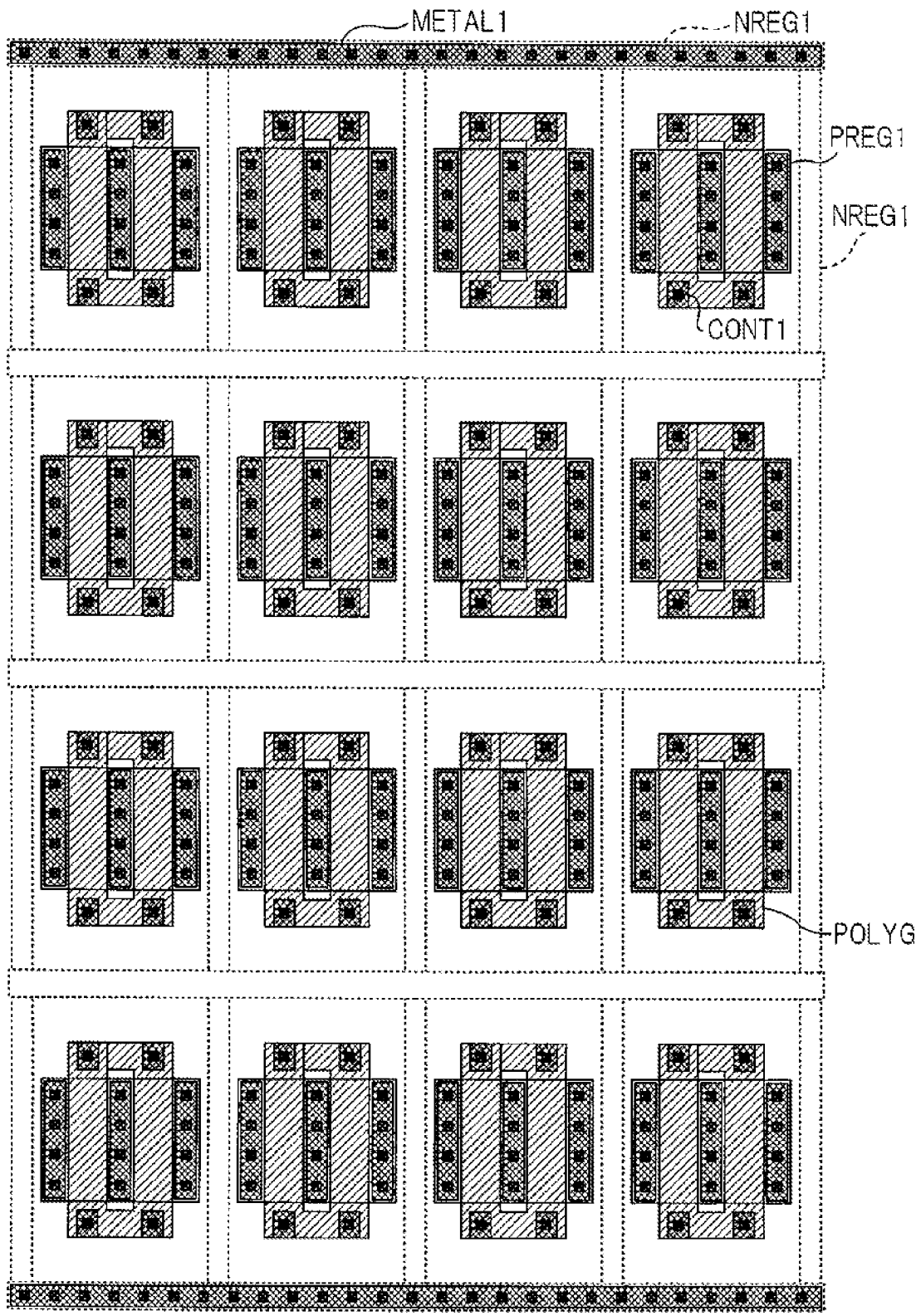
FIG. 24 is a diagram illustrating a modified example of the PMOS basic cell structure of the analog circuit cell array according to the embodiment.

FIG. 24 illustrates the basic structure when the structure in which the well-feeding regions are also provided on the left and right sides of the cells is applied to the structure of FIG. 6 in which the gate electrodes of the two PMOS transistors in each basic cell are connected together using the POLYG. In such cases as where signals are brought out by passing the METAL1 interconnect lines between the gate/METAL1 contact portions, as with the case of the PMGD1 illustrated in FIG. 18, the cell structure of FIG. 24 better facilitates the interconnections. It is of course possible to also apply the structure of FIG. 24 to the NMOS basic cells.

While the basic structure of the PMOS array and the basic structure of the NMOS array have been described above using similar examples, it will be appreciated that these possible structures can be used in combination.

Figure 25:
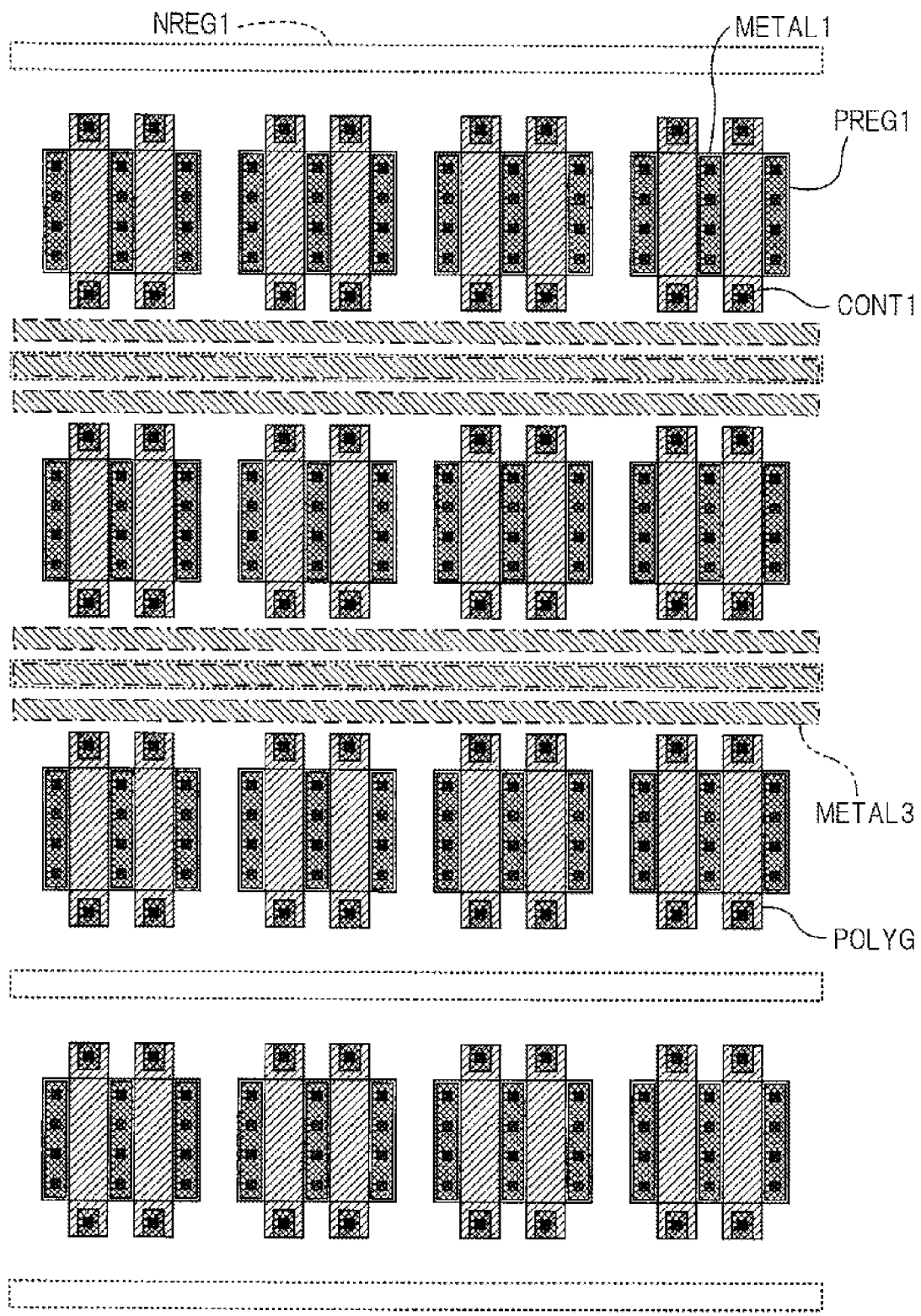
FIG. 25 is a diagram explaining interconnect channels at a third layer in the analog circuit cell array according to the embodiment.

FIG. 25 illustrates one example in which the constitution of the interconnect channels applied up to the METAL2 level of the PMOS array illustrated in FIG. 8 is applied to the third interconnect layer METAL3. In FIG. 25, METAL3 indicates the third metal interconnect layer. In FIG. 25, the METAL3 is represented by oblique hatching rotated 90 degrees relative to that of POLYG and enclosed by double-dashed lines.

As previously explained, it is desirable in principle that the METAL1 be used for lateral interconnect lines and the METAL2 for longitudinal interconnect lines from the viewpoint of ease of interconnections. It is therefore a natural choice to form the METAL3 interconnect lines as lateral interconnect lines crossing at right angles with the METAL2 interconnect lines. In the example of FIG. 25, the METAL3 interconnect lines are illustrated as being formed above the METAL1 interconnect lines. They are illustrated as possible interconnect lines, not the actual circuit interconnect lines.

Figure 26:
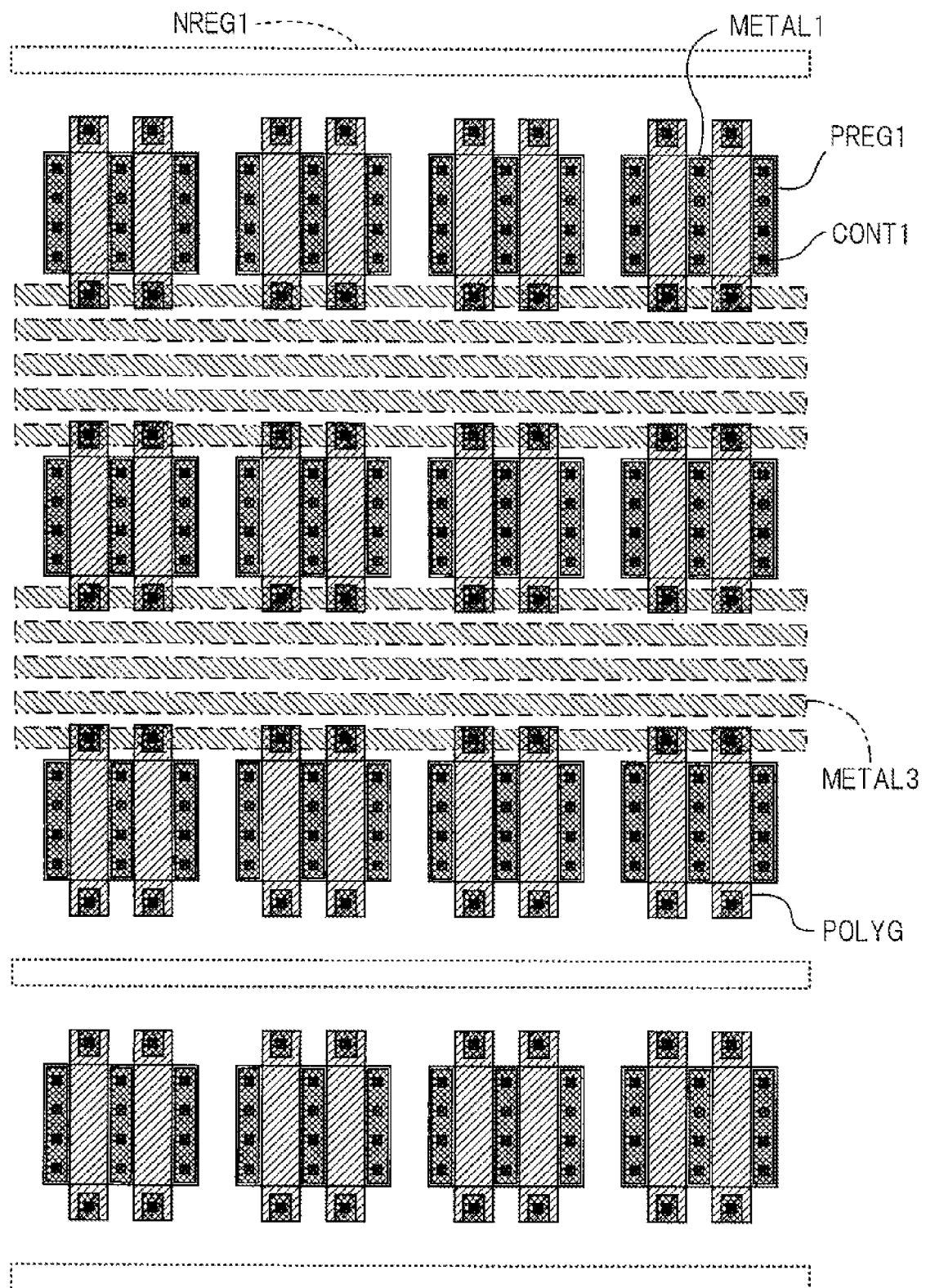
FIG. 26 is a diagram explaining interconnect channels at the third layer in the analog circuit cell array according to the embodiment.

FIG. 26 illustrates another example of the METAL3 interconnect lines. The METAL1 is already present at the gate/METAL1 contacts at the edges of the POLYGs. As a result, the edges of the POLYGs cannot be used as METAL1 signal interconnect channels, but when the METAL3 interconnect lines are used, interconnect channels can be formed including the edge portions of the POLYGs. In this case also, no interconnect lines should be provided above the channel region where an inversion layer is formed.

Figure 27:
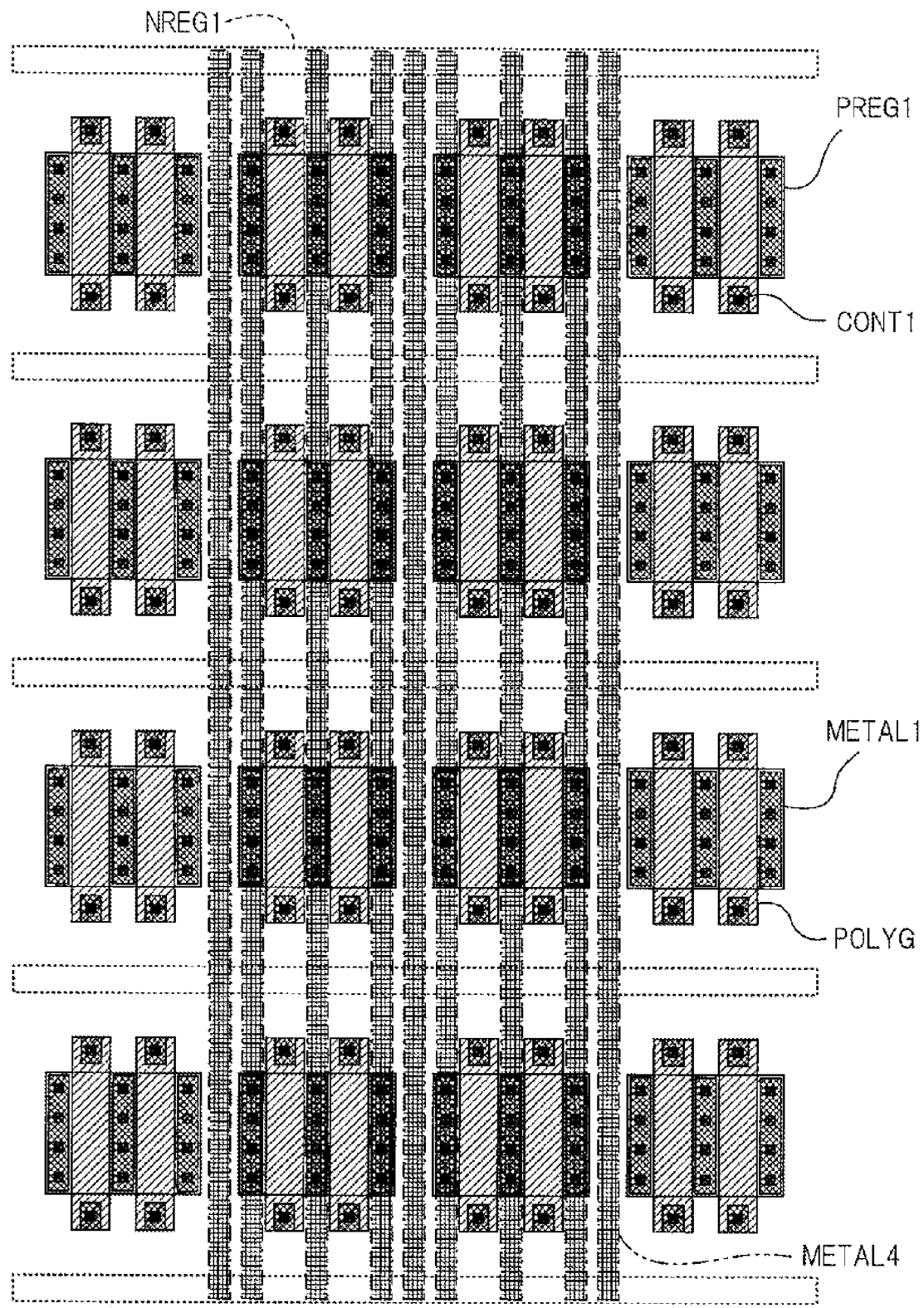
FIG. 27 is a diagram explaining interconnect channels at a fourth layer in the analog circuit cell array according to the embodiment.

FIG. 27 illustrates the constitution of interconnect channels to be provided at a fourth metal interconnect layer METAL4 in the PMOS array illustrated in FIG. 8. In FIG. 27, the METAL4 is represented by hatching with horizontal and vertical lines, like that used for the METAL2, but enclosed by double-dashed lines.

The METAL4 interconnect channels of FIG. 27 can be formed in substantially the same manner as the METAL2. In this case also, no interconnect lines should be provided above the current channels.

Figure 28:
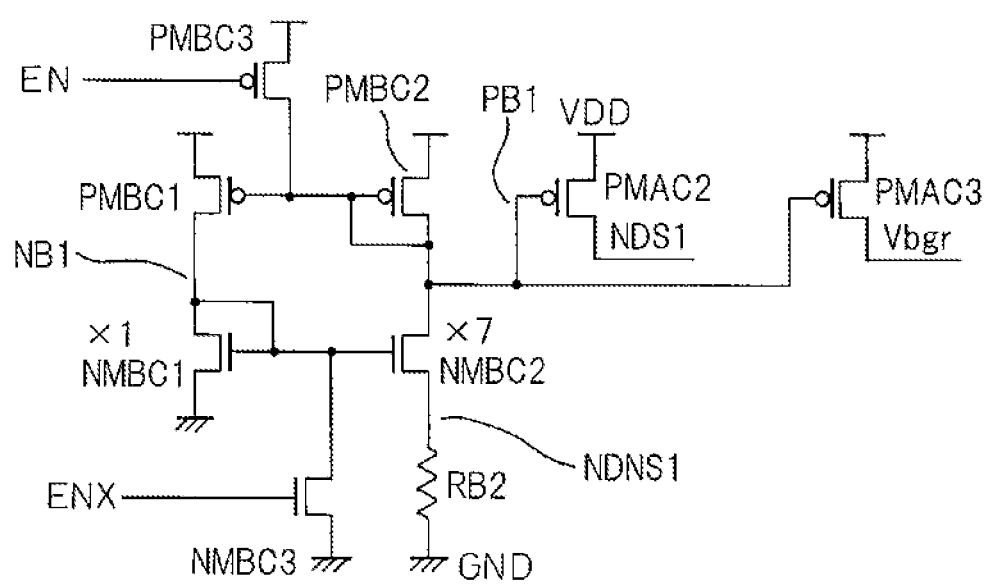
FIG. 28 is a diagram illustrating an example of a bias circuit implemented using the analog circuit cell array according to the embodiment.

FIG. 28 illustrates an example of a bias circuit. The following illustrates an example of how such a bias circuit can be implemented using the layout method of the present invention.

In FIG. 28, PMBC1, PMBC2, and PMBC3 are PMOS transistors forming the bias circuit, NMBC1, NMBC2, and NMBC3 are NMOS transistors forming the bias circuit, RB2 is a resistor, PMAC2 and PMAC3 are, for example, the PMOS transistors illustrated in FIG. 12, PB1 is a bias voltage applied to the PMOS transistors, EN is an enable signal, ENX is an enable signal whose phase is reversed relative to EN and whose L state triggers the circuit into operation, NB1 is a bias voltage applied to the NMOS transistors, NDS1 and Vbgr are the nodes designated by the same names in FIG. 12, and NDNS1 is the source node of the NMBC2.

Figure 29:
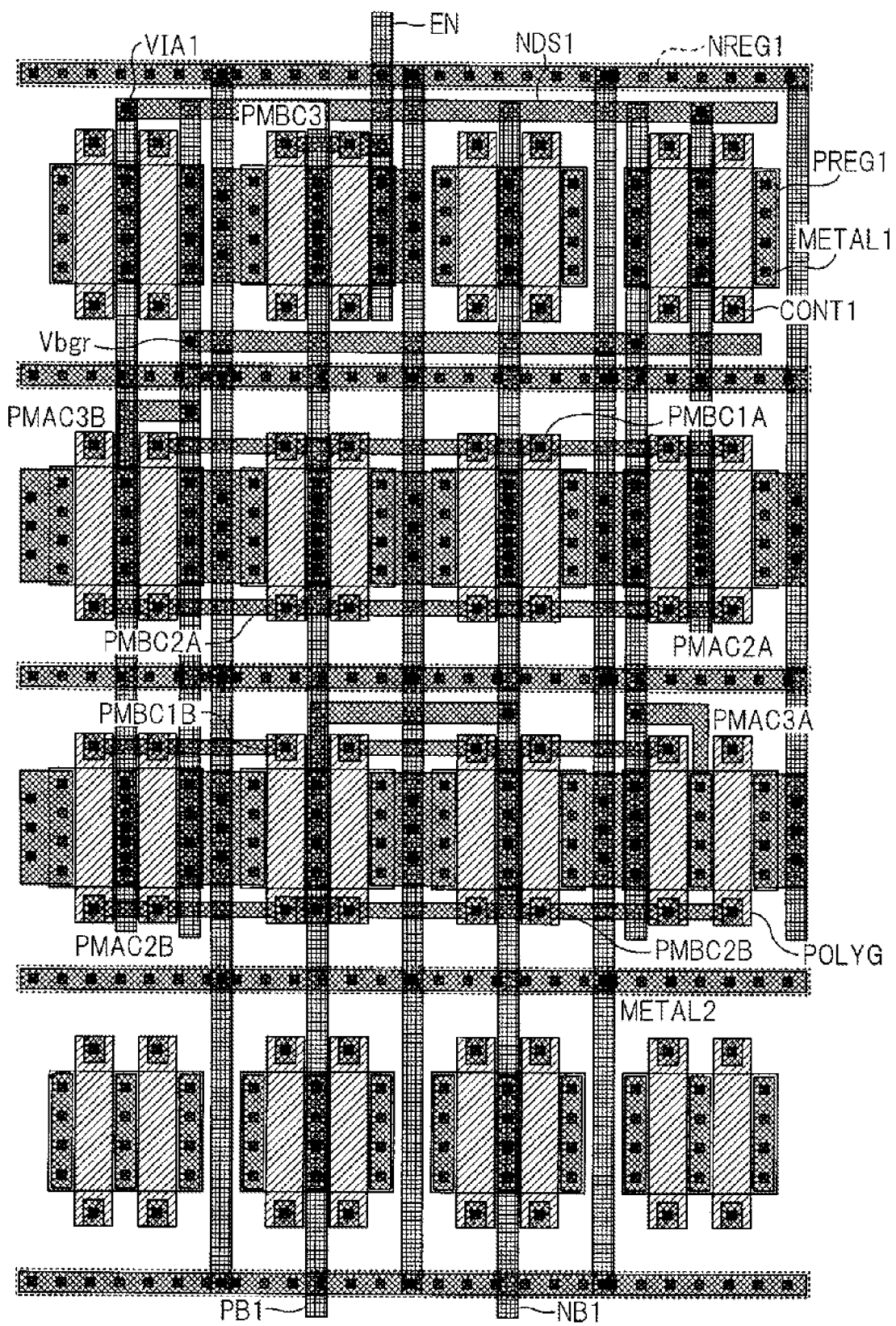
FIG. 29 is a diagram illustrating an example of layout of the PMOS section of the bias circuit up to the second interconnect level.
Figure 30:
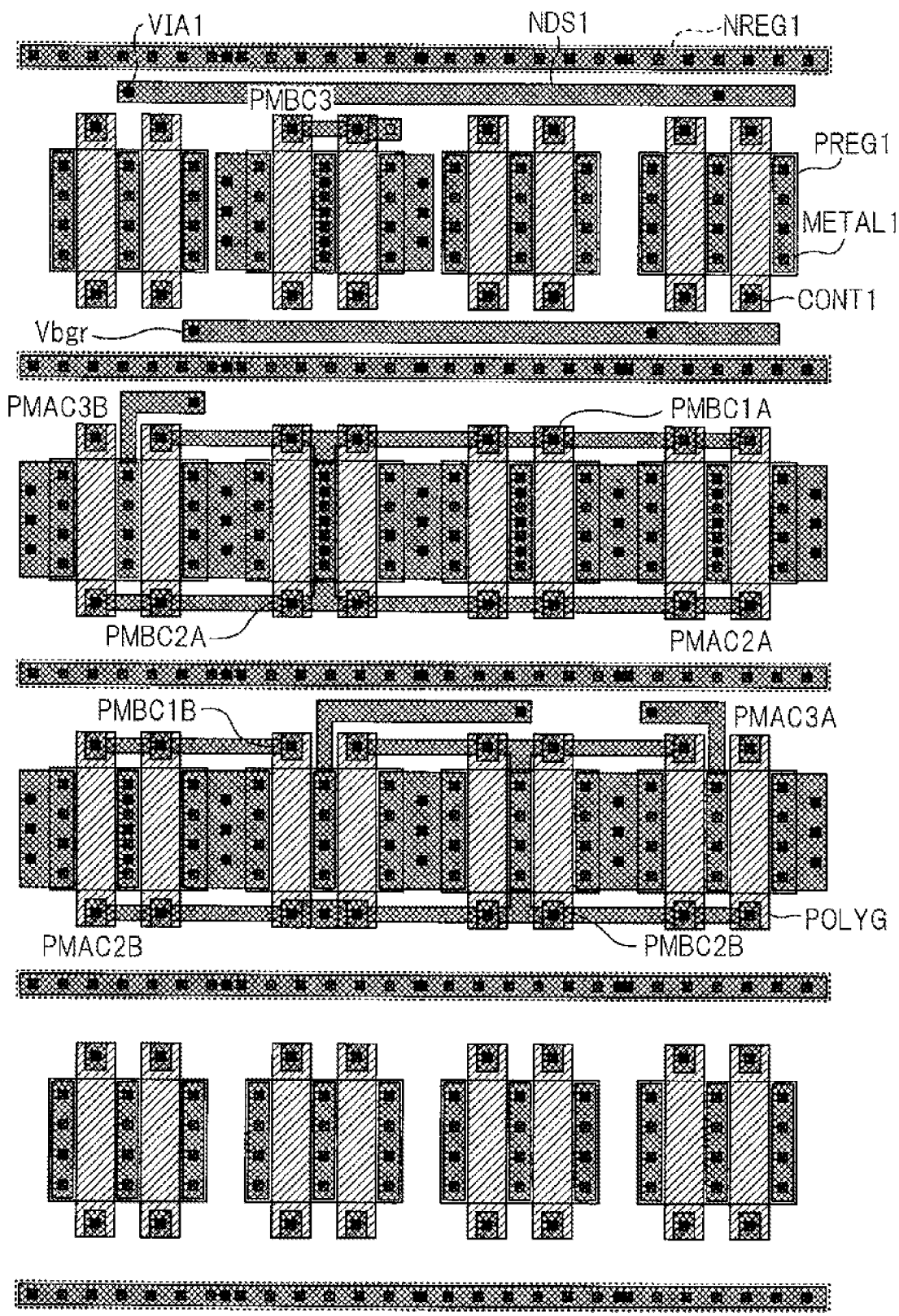
FIG. 30 is a diagram illustrating an example of layout of the PMOS section of the bias circuit at the first interconnect level.

FIG. 29 illustrates a layout example of the PMOS section of the bias circuit of FIG. 28. The method of depicting the layout layers is the same as that used in the previously illustrated figures. Some of the corresponding circuit node names are also illustrated. FIG. 29 illustrates the layout up to the METAL2 interconnect level, while FIG. 30 illustrates the layout only at the METAL1 interconnect level.

The layout example of the bias circuit of FIG. 28 will be described with reference to FIGS. 29 and 30.

The transistors that need matching in FIG. 28 are the PMBC1 and PMBC2 forming the transistor pair, and it is also desirable that the characteristics of the PMAC2 and PMAC3 are identical to those of the transistor pair.

In FIG. 29, the PMBC1 and PMBC2 are split, the former into PMBC1A and PMBC1B and the latter into PMBC2A and PMBC2B, and are arranged in a common centroid configuration. The PMAC2 and PMAC3 are also split in like manner and arranged in a common centroid configuration. As illustrated in FIG. 30, since the gate potential is common to these eight transistors, in each row the gates can be connected together in the lateral direction by using METAL1 interconnect lines. Further, since the gate electrodes are also connected to the drain of the PMBC2, the drain and gate electrodes of the PMBC2A are connected together by the METAL1, and the drain and gate electrodes of the PMBC2B are connected together by the METAL1, as illustrated in FIG. 30.

As can be seen from FIG. 30, since the gates of the eight transistors are connected to the drain by the METAL1, the drain of the PMBC2 acts as an antenna diode. When the drain electrodes of the PMBC2, PMBC1, PMAC2, and PMAC3, respectively arranged in a common centroid configuration, are connected together by using longitudinally extending METAL2 interconnect lines and laterally extending METAL1 interconnect lines, the circuit interconnections are completed. Further, since the source potential of these transistors is VDD, the sources are connected to the VDD by using longitudinally extending METAL2 interconnect lines.

FIG. 29 illustrates the result of the interconnect layout accomplished based on the above basic constitution. When a different signal line is present above a drain electrode, the signal from the drain electrode is brought out by using the METAL1 passed between the gate contacts. The drain electrode of the PMBC1B and the drain electrode of the PMAC3b are brought out in this manner. By connecting the NDS1 and Vbgr to laterally extending interconnect lines, the circuit can be connected, for example, to the NDS1 illustrated in FIG. 19, to complete the fabrication of the PMOS differential circuit. The circuit portion relating to the Vbgr interconnect line is not illustrated here, but it can be brought out to a desired position by using longitudinal and lateral interconnect lines. Since there is no need to be concerned about the antenna effect for the drain interconnects, NDS1, and Vbgr, the configuration such as illustrated in FIG. 29 or 19 is effective.

The PMBC3 is a device for powerdown control for holding the PB1 at the VDD potential. By connecting the drain to the PB1 interconnect line, the source to VDD, and the gate to EN, the circuit interconnections illustrated in FIG. 28 can be accomplished. Since there is no need to match the characteristics of the powerdown control device, the device is placed in the uppermost row of the array, as illustrated in FIGS. 29 and 30. In this way, by arranging devices that do not need matching or whose matching priority is low in the peripheral area, and placing the devices that most need matching in the center area, the peripheral area of the array can be used without wasting space, and the devices arranged in this area can be made to act as dummy devices for the devices placed in the center area of the array.

FIGS. 29 and 30 have illustrated an implementation example of the layout by taking as an example the PMOS section of the bias circuit of FIG. 28, but it will be appreciated that the layout of the NMOS section of the bias circuit can be easily implemented in a manner similar to that illustrated in FIGS. 19 and 29.

With the circuit configuration and layout described above, the offset voltage of the operational amplifier can be further reduced. This promises to improve the output voltage accuracy of the bandgap circuit. The output voltage accuracy of the regulator circuit using the bandgap circuit also improves.

With the analog circuit cell array disclosed in the embodiment, the production lead time can be greatly reduced, since a high-accuracy analog circuit can be easily produced by just forming an interconnection pattern according to the circuit specification.

While the embodiment of the invention has been described above, it will be easily understood by those skilled in the part that the techniques disclosed herein are not limited to the embodiment described above and that various modifications can be made to it.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An analog integrated circuit comprising:
an analog circuit cell array including a plurality of transistor cells arranged in an array, each of the transistor cells comprising:

a first source region, a first channel region, a common drain region, a second channel region, and a second source region arranged in a first direction one adjacent to another; and a first gate electrode and a second gate electrode arranged on the first channel region and the second channel region, respectively, and the first gate electrode and the second gate electrode being extended in a second direction perpendicular to the first direction;

wherein the analog integrated circuit comprises a transistor pair arranged in a common centroid configuration by using 2*2 transistor cells located in a center area of the array in which the transistor cells are arranged, such that the first gate electrode and the second gate electrode of a given transistor cell in the 2*2 transistor cells are connected to the first gate electrode and the second gate electrode of another transistor cell arranged diagonally from the given transistor cell, and wherein the first gate electrode and the second gate electrode of a transistor of the transistor pair are connected to a common drain region of a transistor cell, of the plurality of transistor cells, located outside of the center area of the array, and wherein a first gate electrode, a second gate electrode, a first source region and a second source region of the transistor cell, of the plurality of transistor cells, located outside of the center area of the array, are connected together.

2. An analog integrated circuit comprising:

an analog circuit cell array including a plurality of transistor cells arranged in an array, each of the transistor cells comprising:

a first source region, a first channel region, a common drain region, a second channel region, and a second source region arranged in a first direction one adjacent to another; and a first gate electrode and a second gate electrode arranged on the first channel region and the second channel region, respectively, and the first gate electrode and the second gate electrode being extended in a second direction perpendicular to the first direction;

wherein the analog integrated circuit comprises a transistor pair arranged in a common centroid configuration by using 2*2 transistor cells located in a center area of the array in which the transistor cells are arranged, such that the first gate electrode and the second gate electrode of a given transistor cell in the 2*2 transistor cells are connected to the first gate electrode and the second gate electrode of another transistor cell arranged diagonally from the given transistor cell, and wherein the first gate electrode and the second gate electrode of a first transistor of the transistor pair are connected to a common drain region of a first transistor cell, of the plurality of transistor cells, located outside of the center area of the array, and wherein the first gate electrode and the second gate electrode of a second transistor of the transistor pair are connected to the common drain region of a second transistor cell, of the plurality of transistor cells, located outside of the center area of the array.

3. The analog integrated circuit according to claim 2, wherein the each transistor cell includes an interconnecting electrode for interconnecting the first gate electrode and the second gate electrode.

4. The analog integrated circuit according to claim 2, wherein the first gate electrode and the second gate electrode of the each transistor cell extend outwardly of the first channel region and the second channel region, respectively, and are provided with interconnect contacts on outwardly extending portions.

5. The analog integrated circuit according to claim 2, further comprising: a diffusion region extending in the first direction, arranged along a boundary area extending in the first direction of the each transistor cell, for feeding a well in the each transistor cell.

6. The analog integrated circuit according to claim 2, further comprising metal interconnect lines, wherein the metal interconnect lines are not placed above the first channel region and the second channel region of any transistor cell.

7. The analog integrated circuit according to claim 2, wherein the plurality of transistor cells includes PMOS transistor cells and NMOS transistor cells.

8. The analog integrated circuit according to claim 3, wherein the plurality of transistor cells includes PMOS transistor cells and NMOS transistor cells.

9. The analog integrated circuit according to claim 4, wherein the plurality of transistor cells includes PMOS transistor cells and NMOS transistor cells.

10. The analog integrated circuit according to claim 5, wherein the plurality of transistor cells includes PMOS transistor cells and NMOS transistor cells.

11. The analog integrated circuit according to claim 6, wherein the plurality of transistor cells includes PMOS transistor cells and NMOS transistor cells.

12. The analog integrated circuit according to claim 2, wherein the first gate electrode and the second gate electrode of each of two transistor cells contained in a transistor of the transistor pair are connected to each other through a first connection wiring located in a first wiring layer.

13. The analog integrated circuit according to claim 2, wherein the first gate electrode and the second gate electrode of the first transistor of the transistor pair are connected to the common drain region of the first transistor cell through a second connection wiring located in the first wiring layer.

14. The analog integrated circuit according to claim 2, wherein the transistor cells are arranged in four or more rows and four or more columns.

* * * * *